United States Patent
Kuniyasu et al.

(10) Patent No.: US 10,784,417 B2
(45) Date of Patent: Sep. 22, 2020

(54) WAVELENGTH CONVERSION FILM

(71) Applicant: FUJIFILM Corporation, Tokyo (JP)

(72) Inventors: Satoshi Kuniyasu, Kanagawa (JP); Tatsuya Oba, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/519,460

(22) Filed: Jul. 23, 2019

(65) Prior Publication Data
US 2019/0348578 A1   Nov. 14, 2019

Related U.S. Application Data

(63) Continuation of application No. PCT/JP2017/045699, filed on Dec. 20, 2017.

(30) Foreign Application Priority Data

Jan. 24, 2017   (JP) .................................. 2017-010382

(51) Int. Cl.
  *H01L 33/50*   (2010.01)
  *B32B 27/30*   (2006.01)
  *H01L 21/02*   (2006.01)

(52) U.S. Cl.
  CPC .......... *H01L 33/504* (2013.01); *B32B 27/306* (2013.01); *H01L 21/02164* (2013.01); *H01L 33/501* (2013.01); *H01L 33/502* (2013.01)

(58) Field of Classification Search
  CPC ... H01L 33/501; H01L 33/502; H01L 33/504; B32B 27/306

(Continued)

(56) References Cited

U.S. PATENT DOCUMENTS

| | | | |
|---|---|---|---|
| 6,432,516 B1 * | 8/2002 | Terasaki | B32B 27/08 428/195.1 |
| 2005/0029513 A1 * | 2/2005 | Kawashima | C23C 14/024 257/40 |

(Continued)

FOREIGN PATENT DOCUMENTS

| | | |
|---|---|---|
| JP | 2013-210488 A | 10/2013 |
| JP | 5744033 B2 | 7/2015 |

(Continued)

OTHER PUBLICATIONS

International Search Report issued in PCT/JP2017/045699 dated Apr. 3, 2018.

(Continued)

*Primary Examiner* — Christopher M Raabe
(74) *Attorney, Agent, or Firm* — Edwards Neils LLC; Jean C. Edwards, Esq.

(57) ABSTRACT

Provided is a wavelength conversion film that suppresses a deterioration of quantum dots by oxygen and is capable of suppressing a decrease in brightness. The wavelength conversion film includes a wavelength conversion layer and auxiliary layers sandwiching the wavelength conversion layer, in which the wavelength conversion layer has polyvinyl alcohol and cured substance particles of a (meth) acrylate compound including wavelength conversion particles, and an oxygen permeability of the auxiliary layer is $1.0 \times 10^0$ to $1.0 \times 10^{-2}$ cc/(m²·day·atm).

11 Claims, 2 Drawing Sheets

(58) Field of Classification Search
USPC .......................................................... 313/501
See application file for complete search history.

(56) References Cited

U.S. PATENT DOCUMENTS

| | | |
|---|---|---|
| 2012/0256141 A1 | 10/2012 | Nick et al. |
| 2016/0161066 A1 | 6/2016 | Sung et al. |
| 2016/0161088 A1 | 6/2016 | Sung et al. |
| 2018/0129085 A1 | 5/2018 | Kuniyasu et al. |
| 2018/0238519 A1* | 8/2018 | Kuniyasu .................. F21V 9/30 |
| 2018/0299102 A1* | 10/2018 | Chikushi .................. G02B 1/14 |
| 2019/0292446 A1* | 9/2019 | Oba .................. G02F 1/133603 |
| 2019/0302497 A1* | 10/2019 | Kuniyasu ................ G02B 5/20 |

FOREIGN PATENT DOCUMENTS

| | | |
|---|---|---|
| JP | 2016-136281 A | 7/2016 |
| WO | 2015/194630 A1 | 12/2015 |
| WO | 2017/010394 A1 | 1/2017 |

OTHER PUBLICATIONS

Written Opinion issued in PCT/JP2017/045699 dated Apr. 3, 2018.
International Preliminary Report on Patentability completed by WIPO dated Jul. 30, 2019 in connection with International Patent Application No. PCT/JP2017/045699.
Notification of Reasons for Refusal issued by the Japanese Patent Office dated Oct. 29, 2019, in connection with Japanese Patent Application No. 2017-010382.

* cited by examiner

WAVELENGTH CONVERSION FILM

CROSS-REFERENCE TO RELATED APPLICATIONS

This application is a Continuation of PCT International Application No. PCT/JP2017/045699 filed on Dec. 20, 2017, which was published under Article 21(2) in Japanese, and which claims priority under 35 U.S.C. § 119(a) to Japanese Patent Application No. 2017-010382 filed on Jan. 24, 2017. The above applications are hereby expressly incorporated by reference, in their entirety, into the present application.

BACKGROUND OF THE INVENTION

1. Field of the Invention

The present invention relates to a wavelength conversion film.

2. Description of the Related Art

The use of flat panel displays such as liquid crystal display (LCD) devices as a space-saving image display device consuming a small amount of power is broadening every year. For recent liquid crystal display devices, there has been a demand for additional power saving, improvement in color reproducibility, or the like as the improvement of LCD performance.

In response to the power saving of backlights in LCDs, the use of a wavelength conversion layer including, as a light-emitting material (fluorescent body), quantum dots (QD, also referred to as quantum point) that converts the wavelength of incident light and releases the light is proposed in order to increase the light use efficiency and improve color reproducibility.

The quantum dot refers to an electron in a state in which the migration direction of the electron is restricted in all directions three-dimensionally, and, in a case where a nanoparticle in a semiconductor is surrounded by a high potential barrier three-dimensionally, this nanoparticle becomes a quantum dot. The quantum dot develops a variety of quantum effects. For example, a "quantum size effect" by which the state density (energy level) of an electron is split is developed. According to this quantum size effect, the absorption wavelength or light emission wavelength of light can be controlled by changing the size of the quantum dot.

Generally, such quantum dots are dispersed in a resin or the like and are disposed between a backlight and a liquid crystal panel and used as, for example, a wavelength conversion film that converts wavelengths.

In a case where excitation light is incident on the wavelength conversion film from the backlight, the quantum dots are excited, and fluorescent light is emitted. Here, white light can be embodied by using quantum dots having different light emission characteristics and causing the respective quantum dots to emit light having a small half width such as red light, green light, or blue light. Fluorescent light generated by quantum dots has a small half width, and thus it is possible to increase the brightness of white light to be obtained and achieve a design that is excellent in terms of color reproducibility by appropriately selecting a wavelength.

However, quantum dots have a problem in that the quantum dots are likely to be deteriorated by moisture or oxygen and, particularly, the light emission intensity is decreased by a photooxidation reaction. Therefore, a wavelength conversion film is configured so that gas barrier films are laminated on both main surfaces of a resin layer including quantum dots that is a wavelength conversion layer including quantum dots (hereinafter, also referred to as "wavelength conversion layer") to protect the wavelength conversion layer.

In addition, JP5744033B describes coated particles obtained by dispersing quantum dots in a parent material and coating the outermost surface with a poorly oxygen permeable resin, and that the coated particles are used in an optical film.

SUMMARY OF THE INVENTION

Here, according to the present inventors' studies, it was found that, in a case where a wavelength conversion film is configured to have a wavelength conversion layer sandwiched by gas barrier films and the gas barrier film has a strong gas barrier property, a problem of the brightness of light that is released from the wavelength conversion film becoming low is caused.

Generally, a gas barrier film has a barrier layer made of an inorganic material or an organic material. The barrier layer in a gas barrier film having a strong gas barrier property is formed to be denser. Therefore, it is considered that light incident on the wavelength conversion layer in the wavelength conversion film and light that is converted in wavelength in and released from the wavelength conversion layer in the wavelength conversion film are significantly absorbed when passing through the gas barrier film (barrier layer), and thus the brightness becomes low.

The present invention has been made in consideration of the above-described circumstance, and an object of the present invention is to provide a wavelength conversion film that suppresses the deterioration of quantum dots by oxygen and is capable of suppressing a decrease in brightness.

As a result of intensive studies to achieve the above object, the present inventors have found that the above object can be achieved by a wavelength conversion film including a wavelength conversion layer and auxiliary layers sandwiching the wavelength conversion layer, in which the wavelength conversion layer has polyvinyl alcohol and cured substance particles of a (meth)acrylate compound including wavelength conversion particles, and an oxygen permeability of the auxiliary layer is $1.0 \times 10$ to $1.0 \times 10^{-2}$ cc/($m^2 \cdot day \cdot atm$). Thereafter, the present inventors completed the invention.

That is, it was found that the above-described object can be achieved by the following configurations.

(1) A wavelength conversion film comprising a wavelength conversion layer and auxiliary layers sandwiching the wavelength conversion layer, in which the wavelength conversion layer has polyvinyl alcohol and cured substance particles of a (meth)acrylate compound including wavelength conversion particles, and in which an oxygen permeability of the auxiliary layer is $1.0 \times 10^0$ to $1.0 \times 10^{-2}$ cc/($m^2 \cdot day \cdot atm$).

(2) The wavelength conversion film according to (1), in which a degree of saponification of the polyvinyl alcohol is 86 to 97 mol %.

(3) The wavelength conversion film according to (1) or (2), in which at least one of the auxiliary layers is a layer made of polyvinyl alcohol.

(4) The wavelength conversion film according to any one of (1) to (3), in which at least one of the auxiliary layers is a layer made of copolymer resins of butenediol and vinyl alcohol.

(5) The wavelength conversion film according to any one of (1) to (4), in which at least one of the auxiliary layers is a layer made of copolymer resins of ethylene and vinyl alcohol.

(6) The wavelength conversion film according to any one of (1) to (5), in which at least one of the auxiliary layers is a layer made of silicon oxide.

(7) The wavelength conversion film according to (6), further comprising a support layer which supports the layer made of silicon oxide which is used as an auxiliary layer.

According to the present invention, it is possible to provide a wavelength conversion film that suppresses the deterioration of quantum dots by oxygen and is capable of suppressing a decrease in brightness.

DESCRIPTION OF THE PREFERRED EMBODIMENTS

Figure 1:
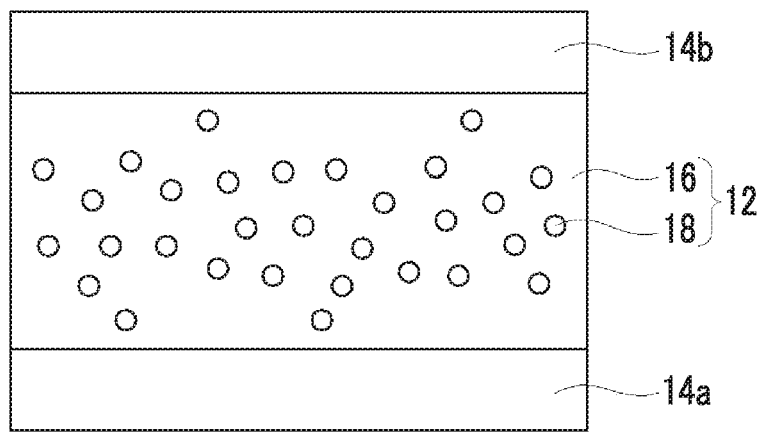
FIG. 1 is a cross-sectional view schematically showing an example of a wavelength conversion film of an embodiment of the present invention.

Hereinafter, an embodiment of a wavelength conversion film according to an embodiment of the present invention will be described with reference to drawings. In the drawings of the present specification, individual members are shown in appropriately changed dimensions in order to make the members easily visible. Meanwhile, numerical ranges expressed using "to" in the present specification include numerical values before and after "to" as the lower limit value and the upper limit value.

In addition, in the present specification, "(meth)acrylates" are used to indicate at least one or both of acrylates and methacrylates. This is also true for "(meth)acryloyl" and the like.

<Wavelength Conversion Film>

A wavelength conversion film according to the embodiment of the present invention includes a wavelength conversion layer, and auxiliary layers sandwiching the wavelength conversion layer, in which the wavelength conversion layer has polyvinyl alcohol and cured substance particles of a (meth)acrylate compound including wavelength conversion particles, and, an oxygen permeability of the auxiliary layer is $1.0\times10^0$ to $1.0\times10^{-2}$ cc/(m$^2$·day·atm).

FIG. 1 is a cross-sectional view schematically showing an example of the wavelength conversion film according to the embodiment of the present invention.

A wavelength conversion film 10a shown in FIG. 1 has a wavelength conversion layer 12 having a binder 16 made of polyvinyl alcohol and a plurality of cured substance particles 18 dispersed in the binder 16 and an auxiliary layer 14a and auxiliary layer 14b that sandwich the wavelength conversion layer 12.

The cured substance particles 18 are "the cured substance particles of the (meth)acrylate compound" in the present invention. In addition, the cured substance particles 18 include wavelength conversion particles such as quantum dots and have a function of converting the wavelengths of light incident on the wavelength conversion film and releasing the light.

Here, in the wavelength conversion film 10a according to the embodiment of the present invention, the oxygen permeabilities of the auxiliary layer 14a and the auxiliary layer 14b are respectively $1.0\times10^0$ to $1.0\times10^2$ cc/(m$^2$·day·atm).

As described above, according to the present inventors' studies, it was found that, in a configuration in which a wavelength conversion layer including quantum dots dispersed in a resin binder is protected by sandwiching the wavelength conversion layer with gas barrier films in order to suppress the deterioration of the quantum dots by oxygen in a wavelength conversion film that has the wavelength conversion layer and converts wavelengths, there is a problem of a decrease in the brightness of light that is released from the wavelength conversion film.

This is considered to be because a barrier layer in the gas barrier film having a strong gas barrier property is formed to be dense and thus light is significantly absorbed when passing through the barrier layer.

In contrast, in the wavelength conversion film 10a according to the embodiment of the present invention, the wavelength conversion layer 12 has a configuration in which a plurality of the cured substance particles 18 including wavelength conversion particles such as quantum dots is dispersed in polyvinyl alcohol which is the binder 16, and the wavelength conversion layer 12 is sandwiched between the auxiliary layer 14a and the auxiliary layer 14b having an oxygen permeability of $1.0\times10^0$ to $1.0\times10^2$ cc/(m$^2$·day·atm).

The wavelength conversion layer has a configuration in which the cured substance particles including wavelength conversion particles are dispersed in the binder made of polyvinyl alcohol and having a strong barrier property, and the wavelength conversion layer is sandwiched between the auxiliary layers having a predetermined oxygen permeability so as to protect the wavelength conversion particles without using a gas barrier film having a strong gas barrier property that increases the light absorption, thereby suppressing a decrease in brightness of the light released from the wavelength conversion film.

Here, even in a case where the wavelength conversion particles are directly dispersed in a resin having a strong barrier property (a low oxygen permeation coefficient), the wavelength conversion particles are agglomerated or the like and are thus not appropriately dispersed. Therefore, in a case where the wavelength conversion particles are contained in the cured substance particles 18, and the cured substance particles 18 are dispersed in the binder 16, it is possible to appropriately disperse the cured substance particles 18, that is, the wavelength conversion particles in the binder 16 even in the case of using a resin having a strong barrier property as the binder 16.

In the case of a configuration in which, simply, the cured substance particles containing the wavelength conversion particles are dispersed in the binder, the wavelength conversion particles present in the vicinities of the surfaces of the wavelength conversion layer are deteriorated by oxygen, and a problem of a decrease in the light emission intensity is caused.

In contrast, in the present invention, the wavelength conversion layer 12 is sandwiched between the auxiliary layer 14a and the auxiliary layer 14b having the oxygen permeability of $1.0\times10^0$ cc/(m$^2$·day·atm) or less. Therefore, the wavelength conversion particles present in the vicinity of the surface of the wavelength conversion layer can be protected from oxygen and prevented from being deteriorated, and a decrease in light emission intensity can be suppressed.

At this time, the absorption of light when passing through the auxiliary layer can be suppressed by setting the oxygen permeability of each of the auxiliary layer 14a and the auxiliary layer 14b to equal to or more than $1.0 \times 10^{-2}$ cc/(m²·day·atm).

In addition, since there is no need for using a highly expensive barrier film having a strong barrier property, it is possible to reduce the costs.

Meanwhile, the oxygen permeability of the auxiliary layer is a value measured using a gas permeation rate testing method based on JIS K 7126-2 2006. As a measurement instrument, an oxygen permeation rate measurement instrument OX-TRAN1_50 manufactured by MOCON, Inc. can be used. The measurement temperature is set to 23° C. and the humidity is set to 50%.

As an SI unit of the oxygen permeability, it is possible to use fm/(s·Pa). 1 fm/(s·Pa) can be converted to 8.752 cc/(m²·day·atm). fm is read as femtometre, and 1 fm is equal to $10^{-15}$ m.

Figure 2:
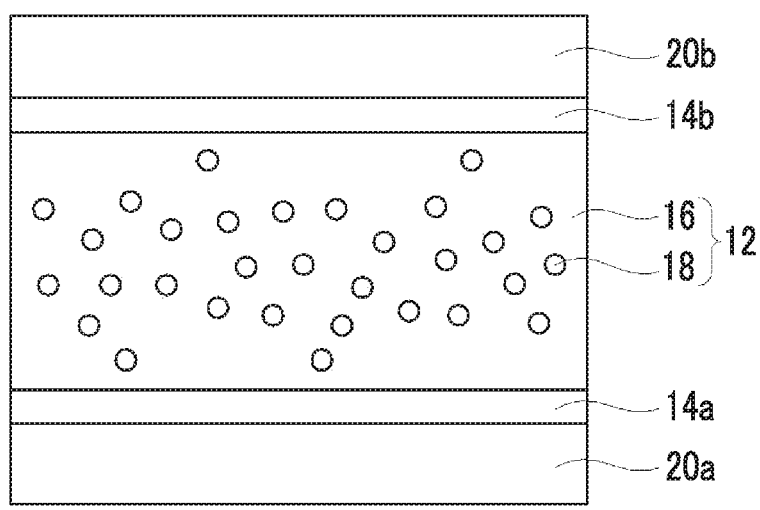
FIG. 2 is a cross-sectional view schematically showing another example of the wavelength conversion film of the embodiment of the present invention.

In the example shown in FIG. 1, the wavelength conversion layer 12 is sandwiched between the auxiliary layer 14a and the auxiliary layer 14b, but the configuration is not limited thereto, and as a wavelength conversion film 10b shown in FIG. 2, a support layer which supports the auxiliary layer may be further provided. As shown in FIG. 2, the wavelength conversion film 10b has a configuration in which a support layer 20a, the auxiliary layer 14a, the wavelength conversion layer 12, the auxiliary layer 14b, and a support layer 20b are laminated in this order.

The wavelength conversion layer 12, the auxiliary layer 14a, and the auxiliary layer 14b may be laminated directly, or may be laminated via a pressure sensitive adhesive or the like.

The pressure sensitive adhesive is not limited, and various known pressure sensitive adhesive materials used in optical films can be used. Specifically, a pressure sensitive adhesive sheet such as an optically clear adhesive (OCA) sheet may be used, or an organic layer obtained by curing a resin by polymerization or heat may be used.

Hereinafter, the respective configurational elements of the wavelength conversion film of the embodiment of the present invention will be described.

[Wavelength Conversion Layer]

The wavelength conversion layer 12 has the binder 16 and a plurality of the cured substance particles 18 dispersed in the binder 16.

In addition, although there is no limitation, the thickness of the wavelength conversion layer 12 is preferably less than 100 μm and more preferably less than 50 μm since it is possible to more preferably suppress a decrease in the light emission intensity and suppress a decrease in brightness attributed to the absorption of light.

The thickness of the wavelength conversion layer 12 is measured as follows.

The wavelength conversion layer 12 is cut in the thickness direction with a microtome using a diamond knife, the cut surface is observed with a microscope, and a distance between a boundary between the wavelength conversion layer 12 and the auxiliary layer 14a and a boundary between the wavelength conversion layer 12 and the auxiliary layer 14b is measured at five points, and the average value thereof is taken as the thickness of the wavelength conversion layer 12.

(Cured Substance Particle)

The cured substance particle 18 is a particulate substance of a (meth)acrylate compound including a wavelength conversion particle.

An average particle diameter of the cured substance particles 18 is not particularly limited, and may be appropriately set according to the thickness of the wavelength conversion layer 12, the amount of the cured substance particles 18 in the wavelength conversion layer 12, and the like. The average particle diameter of the cured substance particles 18 is preferably 0.5 to 5 μm.

Setting the average particle diameter of the cured substance particle 18 to 0.5 μm or more is preferable in that the cured substance particle 18 can be dispersed in the binder 16 without the agglomeration.

By setting the average particle diameter of the cured substance particle 18 to 5 μm or less, it is preferable in that the wavelength conversion layer 12 can be thinned.

The content of the cured substance particle 18 in the wavelength conversion layer 12 may be appropriately set in accordance with the particle diameters of the cured substance particles 18, the content of the wavelength conversion particles in the cured substance particles 18, the degree of saponification of PVA to be the binder 16, and the like, and it is preferably 6% to 60% by volume, more preferably 20% to 40% by volume.

In a case where the content of the cured substance particles 18 in the wavelength conversion layer 12 is set to 6% by volume or more, it is possible to thin the wavelength conversion layer 12, that is, the wavelength conversion film capable of emitting light having a sufficient brightness, which is preferable.

In a case where the content of the cured substance particles 18 in the wavelength conversion layer 12 is set to 60% by volume or less, it is possible to preferably disperse the cured substance particles 18 in the wavelength conversion layer 12, in which an effect of the binder 16 for preventing the deterioration the wavelength conversion particles can be preferably obtained, which is preferable.

In addition, the cured substance particles 18 may include one type of wavelength conversion particles or may include two or more different types of wavelength conversion particles.

—(Meth)acrylate Compound—

A parent material of the cured substance particles 18 is a (meth)acrylate compound.

In the case of using a (meth)acrylate compound as the parent material of the cured substance particles 18 including the wavelength conversion particles, it is possible to suppress the agglomeration of the wavelength conversion particles and appropriately disperse the wavelength conversion particles in the cured substance particles 18.

The (meth)acrylate compound is a compound obtained by polymerizing monofunctional or polyfunctional (meth)acrylate monomers (polymerizable compounds). The polymerizable compound may be a prepolymer or polymer of monomers as long as the polymerizable compound is polymerizable.

——Monofunctional (Meth)Acrylate Monomers——

As the monofunctional (meth)acrylate monomers, acrylic acid, methacrylic acid, and derivatives thereof, more specifically, monomers having one polymerizable unsaturated bond ((meth)acryloyl group) of (meth)acrylic acid in the molecule can be exemplified. Specific examples thereof include compounds exemplified below, but the present embodiment is not limited thereto.

Examples thereof include alkyl (meth)acrylates in which an alkyl group has 1 to 30 carbon atoms such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, and stearyl (meth)acrylate; aralkyl (meth)acrylates in which an aralkyl group has 7 to 20 carbon atoms such as benzyl (meth)acrylate; alkoxyalkyl (meth)acrylates in which an alkoxyalkyl group has 2 to 30 carbon atoms such as butoxyethyl (meth)acrylate; aminoalkyl (meth)acrylates in which a (monoalkyl or dialkyl)aminoalkyl group has 1 to 20 carbon atoms in total such as N,N-dimethylaminoethyl (meth)acrylate; (meth)acrylates of polyalkylene glycol alkyl ether in which an alkylene chain has 1 to 10 carbon atoms and a terminal alkyl ether has 1 to 10 carbon atoms such as (meth)acrylates of diethylene glycol ethyl ether, (meth)acrylates of triethylene glycol butyl ether, (meth)acrylates of tetraethylene glycol monomethyl ether, (meth)acrylates of hexaethylene glycol monomethyl ether, monomethyl ether (meth)acrylates of octaethylene glycol, monomethyl ether (meth)acrylates of nonaethylene glycol, monomethyl ether (meth)acrylates of dipropylene glycol, monomethyl ether (meth)acrylates of heptapropylene glycol, and monoethyl ether (meth)acrylates of tetraethylene glycol; (meth)acrylates of polyalkylene glycol aryl ether in which an alkylene chain has 1 to 30 carbon atoms and a terminal aryl ether has 6 to 20 carbon atoms such as (meth)acrylate of hexaethylene glycol phenyl ether; (meth)acrylates having an alicyclic structure and having 4 to 30 carbon atoms in total such as cyclohexyl (meth)acrylate, dicyclopentanyl (meth)acrylate, isobornyl (meth)acrylate, and methylene oxide-added cyclodecatriene (meth)acrylate; fluorinated alkyl (meth)acrylates having 4 to 30 carbon atoms in total such as heptadecafluorodecyl (meth)acrylate; (meth)acrylates having a hydroxyl group such as 2-hydroxyethyl (meth)acrylate, 3-hydroxypropyl (meth)acrylate, 4-hydroxybutyl (meth)acrylate, mono(meth)acrylate, of triethylene glycol, tetraethylene glycol mono(meth)acrylate, hexaethylene glycol mono(meth)acrylate, octapropylene glycol mono(meth)acrylate, and mono- or di(meth)acrylate of glycerol; (meth)acrylates having a glycidyl group such as glycidyl (meth)acrylate; polyethylene glycol mono(meth)acrylates in which an alkylene chain has 1 to 30 carbon atoms such as tetraethylene glycol mono(meth)acrylate, hexaethylene glycol mono(meth)acrylate, and octapropylene glycol mono(meth)acrylate; (meth) acrylamides such as (meth)acrylamide, N,N-dimethyl (meth)acrylamide, N-isopropyl (meth)acrylamide, 2-hydroxyethyl (meth)acrylamide, and acryloyl morpholine; and the like.

The amount of the monofunctional (meth)acrylate monomer used is preferably set to 10 parts by mass or more and more preferably set to 10 to 80 parts by mass with respect to 100 parts by mass of the total amount of a curable compound that is included in a solution of a curable composition that turns into cured substance particles from the viewpoint of adjusting the viscosity of the solution of the curable composition to be in a preferred range.

——Bifunctional (Meth)Acrylate Monomers——

As a polymerizable monomer having two polymerizable groups, bifunctional polymerizable unsaturated monomers having two ethylenic unsaturated bond-containing groups can be exemplified. The bifunctional polymerizable unsaturated monomers are suitable for decreasing the viscosity of compositions. In the present embodiment, (meth)acrylate-based compounds having an excellent reactivity and having no problems of a residual catalyst and the like are preferred.

Particularly, neopentyl glycol di(meth)acrylate, 1,9-nonanediol di(meth)acrylate, dipropylene glycol di(meth)acrylate, tripropylene glycol di(meth)acrylate, tetraethylene glycol di(meth)acrylate, hydroxypivalic acid neopentyl glycol di(meth)acrylate, polyethylene glycol di(meth)acrylate, dicyclopentenyl (meth)acrylate, dicyclopentenyloxyethyl (meth)acrylate, dicyclopentanyl di(meth)acrylate, and the like are preferably used in the present invention.

The amount of the bifunctional (meth)acrylate monomer used is preferably set to 5 parts by mass or more and more preferably set to 10 to 80 parts by mass with respect to 100 parts by mass of the total amount of the curable compound that is included in the solution of the curable composition that turns into the cured substance particles from the viewpoint of adjusting the viscosity of the solution of the curable composition to be in a preferred range.

——Tri- or Higher-Functional (Meth)Acrylate Monomers——

As a polymerizable monomer having three or more polymerizable groups, polyfunctional polymerizable unsaturated monomers having three or more ethylenic unsaturated bond-containing groups can be exemplified. These polyfunctional polymerizable unsaturated monomers are excellent in terms of imparting mechanical strength. In the present embodiment, (meth)acrylate-based compounds having an excellent reactivity and having no problems of a residual catalyst and the like are preferred.

Specifically, epichlorohydrin (ECH)-modified glycerol tri(meth)acrylate, ethylene oxide (EO)-modified glycerol tri(meth)acrylate, propylene oxide (PO)-modified glycerol tri(meth)acrylate, pentaerythritol triacrylate, pentaerythritol tetraacrylate, EO-modified phosphate triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, dipentaerythritol penta(meth)acrylate, caprolactone-modified dipentaerythritol hexa(meth)acrylate, dipentaerythritol hydroxypenta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxytetra(meth)acrylate, pentaerythritol tetra(meth)acrylate, and the like are preferred.

Among these, particularly, EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, dipentaerythritol penta(meth)acrylate, pentaerythritol ethoxytetra(meth)acrylate, and pentacrythritol tetra(meth)acrylate are preferably used in the present invention.

The amount of the polyfunctional (meth)acrylate monomer used is preferably set to, with respect to 100 parts by mass of the total amount of the curable compound that is included in the solution of the curable composition that turns into the cured substance particles, 5 parts by mass or more from the viewpoint of the strength of the cured substance particles after curing and more preferably set to 95 parts by mass or less from the viewpoint of suppressing the gelatinization of the solution of the curable composition.

In addition, from the viewpoint of further improving the heat resistance of the cured substance particles, the (meth) acrylate monomer is preferably an alicyclic acrylate. Examples of such monofunctional (meth)acrylate monomers include dicyclopentenyl (meth)acrylate, dicyclopentanyl (meth)acrylate, and dicyclopentenyloxyethyl (meth)acrylate. In addition, examples of the bifunctional (meth)acrylate monomer include tricyclodecane dimethanol di(meth)acrylate.

In addition, the total amount of the polymerizable compounds in the curable composition that forms the cured substance particles is preferably 70 to 99 parts by mass and more preferably 85 to 97 parts by mass with respect to 100 parts by mass of the curable composition from the viewpoint of the handling and curing property of the composition.

Among the above-described (meth)acrylate compounds, the acrylates are more preferred from the viewpoint of the viscosity and photocuring property of the composition. In addition, in the present invention, the polyfunctional polymerizable compounds having two or more polymerizable functional groups are preferred. In the present invention, particularly, the blend ratio of the monofunctional (meth)acrylate compound to the polyfunctional (meth)acrylate compound is preferably 80/20 to 0/100, more preferably 70/30 to 0/100, and still more preferably 40/60 to 0/100 in terms of the weight ratio. In the case of selecting an appropriate ratio, the (meth)acrylate compound has a sufficient curing property, and the viscosity of the composition can be decreased.

In the polyfunctional (meth)acrylate compound, the ratio of the bifunctional (meth)acrylate to the tri- or higher-functional (meth)acrylate is preferably 100/0 to 20/80, more preferably 100/0 to 50/50, and still more preferably 100/0 to 70/30 in terms of the mass ratio. The tri- or higher-functional (meth)acrylate has a higher viscosity than the bifunctional (meth)acrylate, and thus the proportion of the bifunctional (meth)acrylate is preferably greater since the viscosity of the composition can be decreased.

The (meth)acrylate compound preferably includes a compound containing a substituent having an aromatic structure and/or an alicyclic hydrocarbon structure as the polymerizable compound from the viewpoint of enhancing a non-permeability to oxygen, and the content of the polymerizable compound having an aromatic structure and/or an alicyclic hydrocarbon structure in the components is more preferably 50% by mass or more and still more preferably 80% by mass or more. The polymerizable compound having an aromatic structure is preferably a (meth)acrylate compound having an aromatic structure. As the (meth)acrylate compound having an aromatic structure, a monofunctional (meth)acrylate compound having a naphthalene structure, for example, a monofunctional acrylate such as 1- or 2-naphthyl (meth)acrylate, 1- or 2-naphthylmethyl (meth)acrylate, 1- or 2-naphthylethyl (meth)acrylate, or benzyl acrylate having a substituent on an aromatic ring or a bifunctional acrylate such as catechol diacrylate, or xylylene glycol diacrylate is particularly preferred. As the polymerizable compound having an alicyclic hydrocarbon structure, isobornyl (meth)acrylate, dicyclopentanyl (meth)acrylate, dicyclopentanyloxyethyl (meth)acrylate, dicyclopentenyl (meth)acrylate, adamantyl (meth)acrylate, tricyclodecanyl (meth)acrylate, tetracyclododecanyl (meth)acrylate, or the like is preferred.

In addition, in a case where a (meth)acrylate is used as the polymerizable compound, an acrylate is more preferred than a methacrylate from the viewpoint of a superior curing property.

The curable compound that forms the cured substance particles may include, as the polymerizable compounds, both the (meth)acrylate compound having an aromatic structure and/or an alicyclic hydrocarbon structure and a (meth)acrylate having a fluorine atom. Regarding the blend ratio, it is preferable that the (meth)acrylate compound having an aromatic structure and/or an alicyclic hydrocarbon structure accounts for 80% by mass or more of all of the polymerizable compound components and the (meth)acrylate having a fluorine atom accounts for 0.1% to 10% by mass. Furthermore, a blend system in which the (meth)acrylate compound having an aromatic structure and/or an alicyclic hydrocarbon structure is liquid at 25° C. and 1 atmosphere and the (meth)acrylate having a fluorine atom is solid at 25° C. and 1 atmosphere is preferred.

The total content of the polymerizable compounds in the curable compound that forms the cured substance particles is preferably 50% to 99.5% by mass, more preferably 70% to 99% by mass, and particularly preferably 90% to 99% by mass of all of the components excluding the solvent from the viewpoint of improving the curing property and improving the viscosity of the curable compound.

In the curable compound that forms the cured substance particles, regarding the polymerizable compound components, more preferably, it is preferable that the content of a polymerizable compound having a viscosity of 3 to 2,000 mPa·s at 25° C. is 80% by mass or more of all of the polymerizable compounds, it is more preferable that the content of a polymerizable compound having a viscosity of 5 to 1,000 mPa·s is 80% by mass or more, it is particularly preferable that the content of a polymerizable compound having a viscosity of 7 to 500 mPa·s is 80% by mass or more, and it is most preferable that the content of a polymerizable compound having a viscosity of 10 to 300 mPa·s is 80% by mass or more.

Regarding the polymerizable compounds that are included in the curable compound that forms the cured substance particles, the content of a polymerizable compound that is liquid at 25° C. is preferably 50% by mass or more of all of the polymerizable compounds from the viewpoint of temporal stability.

—Wavelength Conversion Particles—

As the wavelength conversion particles, a variety of well-known fluorescent bodies can be used.

Examples thereof include inorganic fluorescent bodies such as rare earth doped garnet, silicate, aluminate, phosphate, ceramic fluorescent bodies, sulfide fluorescent bodies, and nitride fluorescent bodies, organic fluorescent substances such as organic fluorescent dyes and organic fluorescent pigments, and the like. In addition, fluorescent bodies obtained by doping rare earth into semiconductor fine particles and nano fine particles (quantum dots or quantum rods) of a semiconductor are also preferably used. One type of fluorescent body can be used singly, but a plurality of types of fluorescent bodies having different wavelengths may be used in a mixture form or a combination of fluorescent bodies having different material configurations (for example, a combination of rare earth doped garnet and quantum dots) may be used so as to obtain a desired fluorescent spectrum.

Here, in the case of being exposed to oxygen, the above-described fluorescent bodies react with the oxygen and deteriorate in terms of the performance as a fluorescent body. The expression "the fluorescent body being exposed to oxygen" means that the fluorescent body is exposed to an environment including oxygen such as the atmosphere, and the expression "the fluorescent body reacting with oxygen and deteriorating" means that the fluorescent body is oxidized, and thus the performance of the fluorescent body deteriorates (degrades) and mainly means that the fluorescent performance degrades compared to that before the reaction with oxygen.

In the following description, quantum dots will be mainly exemplified as the fluorescent body that deteriorates by oxygen, but the fluorescent body in the present invention is not limited to quantum dots and is not particularly limited as long as the fluorescent body is a material that converts external energy to light or converts light to electricity such as other fluorescent colorants that deteriorate by oxygen.

——Quantum Dots——

The quantum dot is a fine particle of a compound semiconductor that is several nanometers to several tens of nanometers in size and is, at least, excited by incident excitation light and emit fluorescent light.

As the fluorescent body of the present embodiment, at least one type of quantum dots are included, and two or more types of quantum dots having different light emission characteristics can also be included. As well-known quantum dots, there are (A) quantum dots having a light emission central wavelength in a wavelength range of 600 nm or higher and 680 nm or lower, (B) quantum dots having a light emission central wavelength in a wavelength range of 500 nm or higher and lower than 600 nm, and (C) quantum dots having a light emission central wavelength in a wavelength range of 400 nm or higher and lower than 500 nm. The quantum dots (A) are excited by excitation light and emit red light, the quantum dots (B) emit green light, and the quantum dots (C) emit blue light. For example, in a case where blue light is made incident as excitation light on the cured substance particles (wavelength conversion layer) including the quantum dots (A) and the quantum dots (B), it is possible to embody white light using red light that is emitted by the quantum dots (A), green light that is emitted by the quantum dots (B), and blue light that permeates through the cured substance particles. Alternatively, ultraviolet light is made incident as excitation light on the cured substance particles including the quantum dots (A), (B), and (C), whereby it is possible to embody white light using red light that is emitted by the quantum dots (A), green light that is emitted by the quantum dots (B), and blue light that is emitted by the quantum dots (C).

In a case where two or more types of quantum dots having different light emission characteristics are included, the cured substance particles may include two or more types of quantum dots, or two or more types of cured substance particles including one type of quantum dots may be included.

Regarding the quantum dots, it is possible to refer to, for example, Paragraphs 0060 to 0066 of JP2012-169271A, but the quantum dots are not limited to the description of the above-described paragraphs. As the quantum dots, it is possible to use commercially available products with no limitations. Generally, the light emission wavelength of the quantum dots can be adjusted using the composition and size of the particles.

The content of the quantum dots is, for example, preferably approximately 0.01% to 10%/o by mass and more preferably 0.05% to 5% by mass of the total amount of the cured substance particles.

In a case where the content of the wavelength conversion particles in the cured substance particles 18 is set to 0.1% by mass or more, a sufficient amount of the wavelength conversion particles are maintained, and highly bright fluorescent light becomes possible, which is preferable.

In a case where the content of the wavelength conversion particles in the cured substance particles 18 is set to 10% by mass or less, the wavelength conversion particles are preferably dispersed in the cured substance particles 18, and highly bright fluorescent light becomes possible at a high quantum yield, which is preferable.

The quantum dots may be added to the solution of the curable composition that turns into the cured substance particles in a particle state or may be added in a dispersion liquid state in which the quantum dots are dispersed in an organic solvent. The quantum dots are preferably added in a dispersion liquid state from the viewpoint of suppressing the agglomeration of the particles of the quantum dots. The organic solvent that is used to disperse the quantum dots is not particularly limited.

The quantum dots are preferably, for example, core-shell type semiconductor nanoparticles from the viewpoint of improving durability. As the core, it is possible to use II-VI group semiconductor nanoparticles, III-V group semiconductor nanoparticles, multielement-type semiconductor nanoparticles, and the like. Specifically, CdSe, CdTe, CdS, ZnS, ZnSe, ZnTe, InP, InAs, InGaP, and the like are exemplified, but the core is not limited thereto. Among them, CdSe, CdTe, InP, and InGaP are preferred from the viewpoint of emitting visible light at a high efficiency. As the shell, it is possible to use CdS, ZnS, ZnO, GaAs, and complex bodies thereof, but the shell is not limited thereto. Generally, the light emission wavelength of the quantum dots can be adjusted using the composition and size of the particles.

The quantum dots may be spherical particles, may be rod-like particles that are also referred to as quantum rods, and, furthermore, may be tetrapod-like particles. Spherical quantum dots or rod-like quantum dots (that is, quantum rods) are preferred from the viewpoint of narrowing the full width at half maximum (FWHM) and enlarging the color reproduction range.

On the surface of the quantum dot, a ligand having a Lewis basic coordinating group may be coordinated. In addition, it is also possible to use quantum dots in which the above-described ligand has been already coordinated. As the Lewis basic coordinating group, an amino group, a carboxy group, a mercapto group, a phosphine group, a phosphine oxide group, and the like can be exemplified. Specifically, hexylamine, decylamine, hexadecylamine, octadecylamine, oleylamine, myristylamine, laurylamine, oleic acid, mercaptopropionic acid, trioctylphosphine, trioctylphosphine oxide, and the like can be exemplified. Among these, hexadecylamine, trioctylphosphine, and trioctylphosphine oxide are preferred, and trioctylphosphine oxide is particularly preferred.

These quantum dots in which the ligand is coordinated can be produced using a well-known synthesis method. For example, the quantum dots can be synthesized using a method described in JP2007-277514A or a method described in C. B. Murray, D. J. Norris, M. G. Bawendi, Journal American Chemical Society, 1993, 115 (19), pp. 8706 to 8715 or The Journal Physical Chemistry, 101, pp. 9463 to 9475, 1997. In addition, as the quantum dots in which the ligand is coordinated, commercially available products can be used with no limitations. Examples thereof include Lumidot (manufactured by Sigma-Aldrich).

—Polymerization Initiator—

The solution of the curable composition that forms the cured substance particles may include a polymerization initiator, and, as the polymerization initiator, a well-known polymerization initiator can be included. Regarding the polymerization initiator, it is possible to refer to, for example, Paragraph 0037 of JP2013-043382A. The content of the polymerization initiator is preferably 0.1 mol % or more and more preferably 0.5 to 2 mol % of the total amount of the curable compound that is included in the solution. In addition, the content is preferably 0.1% by mass to 10% by mass and more preferably 0.2% by mass to 8% by mass in terms of the percent by mass in the entire curable composition excluding a volatile organic solvent.

——Photopolymerization Initiator——

The curable composition that forms the cured substance particles preferably includes a photopolymerization initiator. As the photopolymerization initiator, any photopolymerization initiator can be used as long as the photopolymerization initiator is a compound that generates an active species that polymerizes the above-described polymerizable compound by light irradiation. As the photopolymerization initiator, a cationic polymerization initiator and a radical polymerization initiator are exemplified, and the radical polymerization initiator is preferred. In addition, in the present invention, a plurality of types of photopolymerization initiators may be jointly used.

The content of the photopolymerization initiator is, for example, 0.01% to 15% by mass, preferably 0.1% to 12% by mass, and more preferably 0.2% to 7% by mass of the entire composition excluding the solvent. In a case where two or more types of photopolymerization initiators are used, the total amount needs to be in the above-described range.

In a case where the content of the photopolymerization initiator is 0.01% by mass or more, there is a tendency that the sensitivity (fast curing property) and the coated film strength improve, which is preferable. On the other hand, in a case where the content of the photopolymerization initiator is set to 15% by mass or less, there is a tendency that the light transmitting property, the coloring property, the handleability, and the like improve, which is preferable. In a system including a dye and/or a pigment, the dye and/or the pigment act as a radical trapping agent in some cases and affect the photopolymerization property and the sensitivity. In consideration of this fact, the amount of the photopolymerization initiator added is optimized in these uses. On the other hand, in the composition that is used in the present invention, a dye and/or a pigment are not essential components, and there is a case where the optimal range of the photopolymerization initiator differs from that in the fields of curable compositions for liquid crystal display color filters and the like.

As the radical photopolymerization initiator, for example, initiators that are currently on sale can be used. As examples of these initiators, it is possible to preferably employ, for example, initiators described in Paragraph 0091 of JP2008-105414A. Among these, acetophenone-based compounds, acylphosphine oxide-based compounds, oxime ester-based compounds are preferred from the viewpoint of curing sensitivity and absorption characteristics.

As the acetophenone-based compounds, hydroxyacetophenone-based compounds, dialkoxyacetophenone-based compounds, and aminoacetophenone-based compounds are preferably exemplified. As the hydroxyacetophenone-based compounds, Irgacure (registered trademark) 2959 (1-[4-(2-hydroxyethoxy)phenyl]-2-hydroxy-2-methyl-1-propene-1-one), Irgacure (registered trademark) 184 (1-hydroxycyclohexyl phenyl ketone), Irgacure (registered trademark) 500 (1-hydroxycyclohexylphenyl ketone, benzophenone), Darocur (registered trademark) 1173 (2-hydroxy-2-methyl-1-phenyl-1-propene-1-one), which are procurable from BASF, are preferably exemplified. As the dialkoxyacetophenone-based compounds, Irgacure (registered trademark) 651 (2,2-dimethoxy-1,2-diphenyl ethane-1-one) procurable from BASF is preferably exemplified.

As the aminoacetophenone-based compounds, Irgacure (registered trademark) 369 (2-benzyl-2-dimethylamino-1-(4-morpholinophenyl) butanone-1), Irgacure (registered trademark) 379 (EG) (2-dimethylamino-2-(4 methylbenzyl)-1-(4-morpholin-4-ylphenyl) butane-1-one), Irgacure (registered trademark) 907 (2-methyl-1[4-methylthiophenyl]-2-morpholinopropane-1-one), which are procurable from BASF, are preferably exemplified.

As the acylphosphine oxide-based compounds, Irgacure (registered trademark) 819 (bis(2,4,6-trimethylbenzoyl)-phenylphosphine oxide), Irgacure (registered trademark) 1800 (bis(2,6-dimethoxybenzoyl)-2,4,4-trimethyl-pentylphosphine oxide), which are procurable from BASF, Lucirin TPO (2,4,6-trimethylbenzoyldiphenylphosphine oxide), and Lucirin TPO-L (2,4,6-trimethylbenzoylphenylethoxyphosphine oxide), which are procurable from BASF, are preferably exemplified.

As the oxime ester-based compounds, Irgacure (registered trademark) OXE01 (1,2-octanedione, 1-[4-(phenylthio)phenyl]-2-(O-benzoyloxime)) and Irgacure (registered trademark) OXE02 (ethanone, 1-[9-ethyl-6-(2-methylbenzoyl)-9H-carbazole-3-yl]-, 1-(O-acetyloxime)), which are procurable from BASF, are preferably exemplified.

As the cationic photopolymerization initiator, sulfonium salt compounds, iodonium salt compounds, oxime sulfonate compounds, and the like are preferred, and 4-methylphenyl [4-(1-methylethyl)phenyl iodonium tetrakis(pentafluorophenyl) borate (PI 2074 manufactured by Rhodia), 4-methylphenyl [4-(2-methylpropyl)phenyl iodonium hexafluorophosphate (IRGACURE 250 manufactured by BASF), IRGACURE PAG103, 108, 121, 203 (manufactured by BASF), and the like are exemplified.

The photopolymerization initiator needs to be selected in a timely manner in consideration of the wavelength of a light source being used, and a photopolymerization initiator that does not generate gas during exposure to light is preferred.

The curable compound that forms the cured substance particles is preferably a radical polymerizable curable composition in which the polymerizable compound is a radical polymerizable compound and the photopolymerization initiator is a radical polymerization initiator that generates a radical by light irradiation.

—Other Additives—

The solution of the curable composition that forms the cured substance particles may contain a polymer dispersant, a viscosity adjuster, a surfactant, an antioxidant, an oxygen getter agent, a polymerization inhibitor, inorganic particles, and the like.

——Polymer Dispersant——

The curable composition that forms the cured substance particles may include a polymer dispersant for dispersing the quantum dots in cured substance particles.

The polymer dispersant is a compound that has a coordinating group that is coordinated on the surfaces of the quantum dots and is represented by General Formula I.

A polymer dispersant having a structure represented by General Formula I is not easily desorbed due to multiple-point adsorption and is capable of imparting a high dispersibility. In addition, adsorption groups are agglomerated in a terminal, and thus the particles are not easily crosslinked to each other, and it is possible to suppress an increase in the liquid viscosity which causes the engulfment of air bubbles.

General Formula I

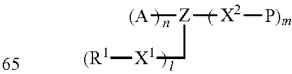

In General Formula I, A is an organic group having a coordinating group that is coordinated in the quantum dot, Z is an (n+m+l)-valent organic linking group, $X^1$ and $X^2$ are single bonds or divalent organic linking groups, $R^1$ represents an alkyl group, an alkenyl group, or an alkynyl group which may have a substituent, and P is a group having a polymer chain including at least one polymer skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, a polyvinyl ether skeleton, and a polystyrene skeleton, all of which have a degree of polymerization of 3 or higher. n and m each are independently numbers of 1 or more, l is a number of 0 or more, and n+m+l is an integer of 2 or more and 10 or less. nA's may be identical to or different from each other. mP's may be identical to or different from each other. $lX^1$'s and $R^1$'s may be identical to or different from each other respectively.

In General Formula I, $X^1$ and $X^2$ represent single bonds or divalent organic linking groups. As the divalent organic linking groups, groups made up of 1 to 100 carbon atoms, 0 to 10 nitrogen atoms, 0 to 50 oxygen atoms, 1 to 200 hydrogen atoms, and 0 to 20 sulfur atoms are exemplified, and the divalent organic linking group may be unsubstituted or have a substituent.

The divalent organic linking groups $X^1$ and $X^2$ are preferably single bonds or divalent organic linking groups made up of 1 to 50 carbon atoms, 0 to 8 nitrogen atoms, 0 to 25 oxygen atoms, 1 to 100 hydrogen atoms, and 0 to 10 sulfur atoms. Single bonds or divalent organic linking groups made up of 1 to 30 carbon atoms, 0 to 6 nitrogen atoms, 0 to 15 oxygen atoms, 1 to 50 hydrogen atoms, and 0 to 7 sulfur atoms are more preferred. Single bonds or divalent organic linking groups made up of 1 to 10 carbon atoms, 0 to 5 nitrogen atoms, 0 to 10 oxygen atoms, 1 to 30 hydrogen atoms, and 0 to 5 sulfur atoms are particularly preferred.

Specific examples of the divalent organic linking groups $X^1$ and $X^2$ can include groups that are configured by combining structural units shown below (a ring structure may be formed).

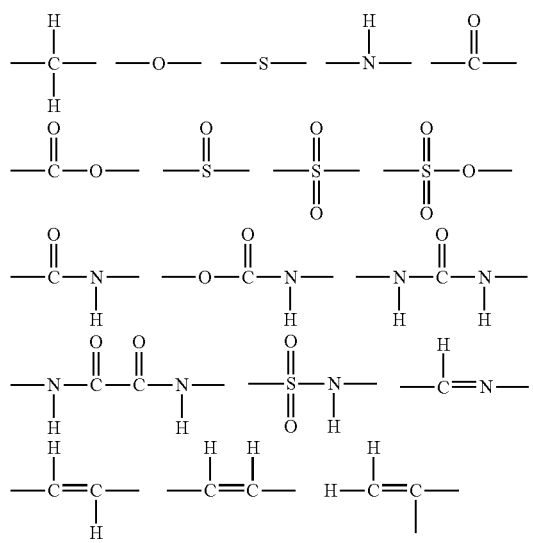

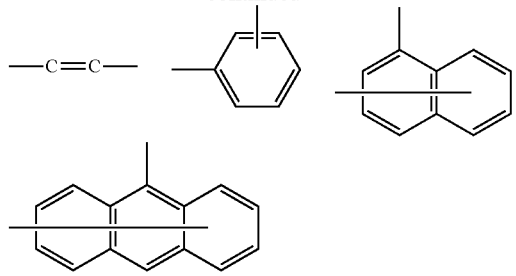

In a case where the divalent organic linking groups $X^1$ and $X^2$ have a substituent, as the substituent, for example, an alkyl group having 1 to 20 carbon atoms such as a methyl group or an ethyl group, an aryl group having 6 to 16 carbon atoms such as a phenyl group or a naphthyl group, an acyloxy group having 1 to 6 carbon atoms such as a hydroxyl group, an amino group, a carboxyl group, a sulfonamide group, an N-sulfonyl amide group, or an acetoxy group, an alkoxy group having 1 to 6 carbon atoms such as a methoxy group or an ethoxy group, a halogen atom such as chlorine or bromine, an alkoxycarbonyl group having 2 to 7 carbon atoms such as a methoxycarbonyl group, an ethoxycarbonyl group, or a cyclohexyloxy carbonyl group, a carbonic acid ester group such as a cyano group or t-butylcarbonate, and the like are exemplified.

As the (n+m+l)-valent organic linking group represented by Z, a group made up of 1 to 100 carbon atoms, 0 to 10 nitrogen atoms, 0 to 50 oxygen atoms, 1 to 200 hydrogen atoms, and 0 to 20 sulfur atoms is exemplified, and the (n+m+l)-valent organic linking group may be unsubstituted or have a substituent.

As the (n+m+l)-valent organic linking group Z, a group made up of 1 to 60 carbon atoms, 0 to 10 nitrogen atoms, 0 to 40 oxygen atoms, 1 to 120 hydrogen atoms, and 0 to 10 sulfur atoms are preferred, groups made up of 1 to 50 carbon atoms, 0 to 10 nitrogen atoms, 0 to 30 oxygen atoms, 1 to 100 hydrogen atoms, and 0 to 7 sulfur atoms is more preferred, and a group made up of 1 to 40 carbon atoms, 0 to 8 nitrogen atoms, 0 to 20 oxygen atoms, 1 to 80 hydrogen atoms, and 0 to 5 sulfur atoms is particularly preferred.

As the (n+m+l)-valent organic linking group Z, a group that is configured of a structural unit shown below or a combination of the structural units (a ring structure may be formed) can be exemplified.

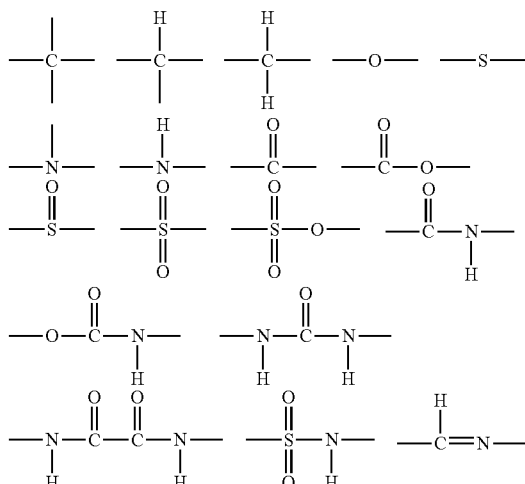

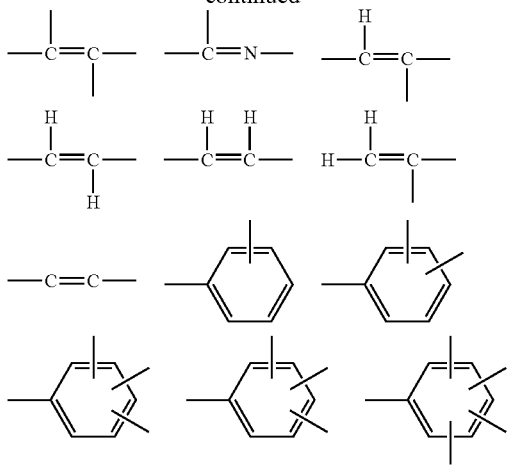
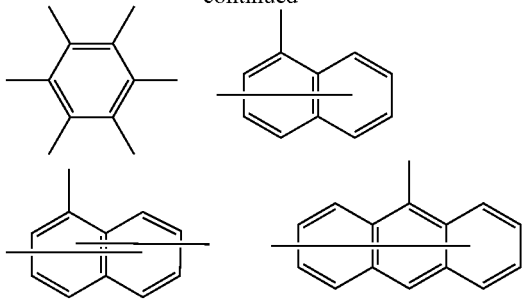
Specific examples (1) to (20) of the (n+m+l)-valent organic linking group Z will be shown below. Here, in the present invention, the (n+m+l)-valent organic linking group Z is not limited thereto. * in the following organic linking groups indicates portions that bond to A, $X^1$, and $X^2$ in General Formula I.
(1)
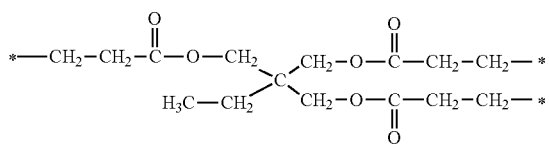
(2)
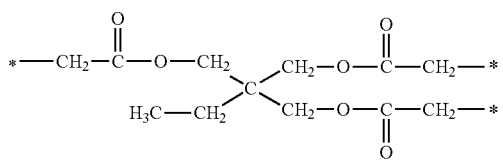
(3)
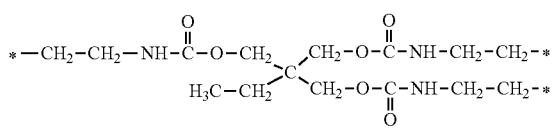
(4)
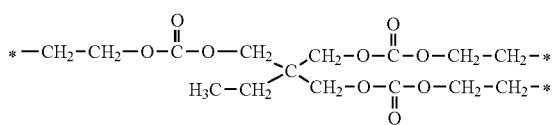
(5)
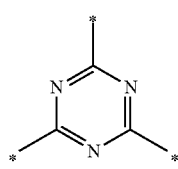
(6)
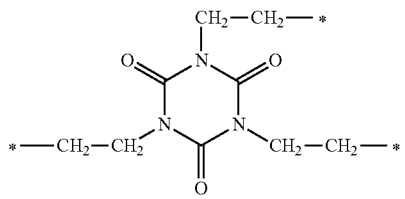
(7)
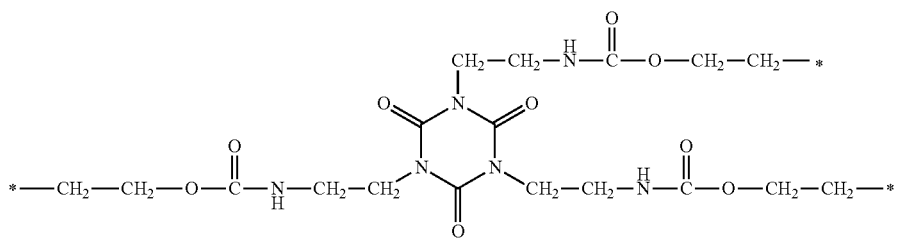
(8)
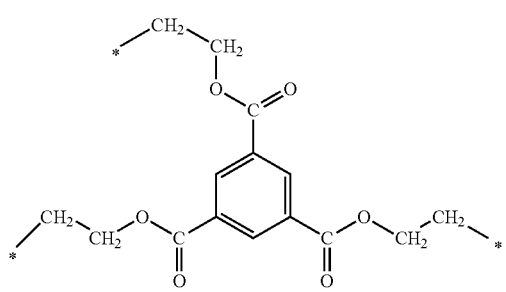
(9)
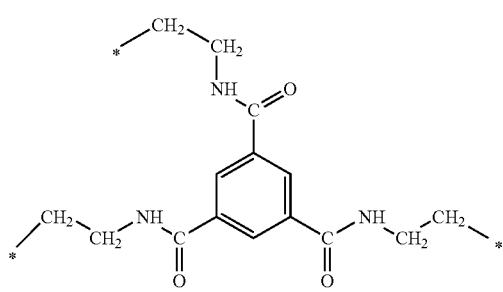

(10)
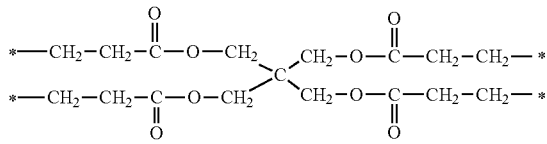

(11)
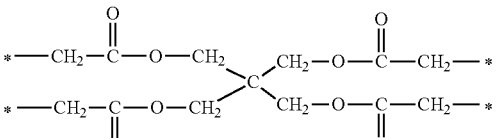

(12)
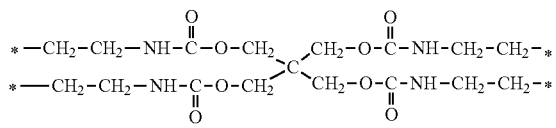

(13)
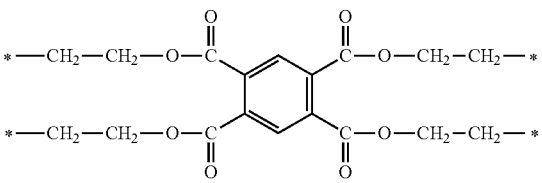

(14)
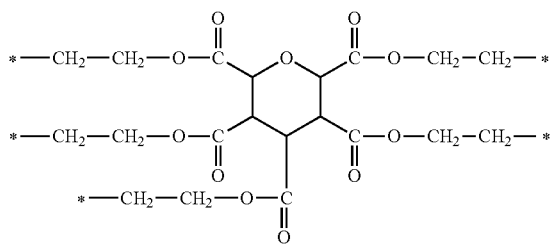

(15)
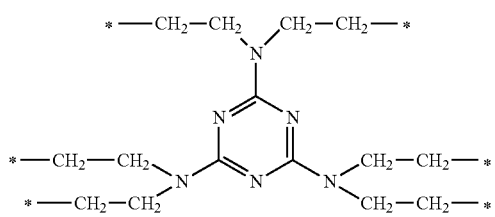

(16)
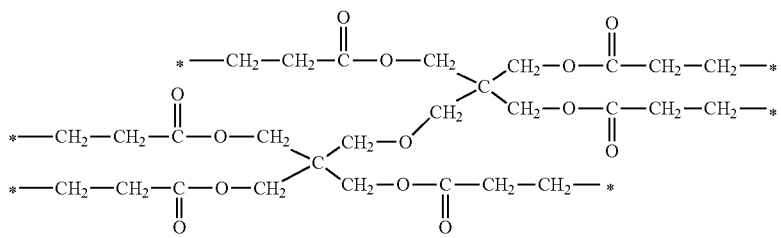

(17)
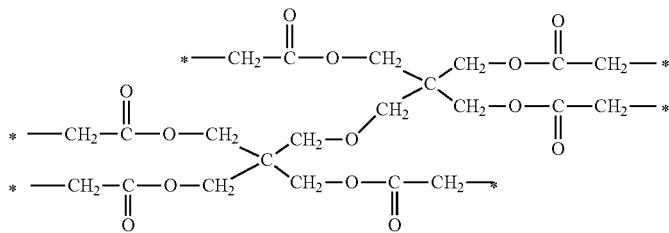

In a case where the (n+m+l)-valent organic linking group Z has a substituent, as the substituent, for example, an alkyl group having 1 to 20 carbon atoms such as a methyl group or an ethyl group, an aryl group having 6 to 16 carbon atoms such as a phenyl group or a naphthyl group, an acyloxy group having 1 to 6 carbon atoms such as a hydroxyl group, an amino group, a carboxyl group, a sulfonamide group, an N-sulfonyl amide group, or an acetoxy group, an alkoxy group having 1 to 6 carbon atoms such as a methoxy group or an ethoxy group, a halogen atom such as chlorine or bromine, an alkoxycarbonyl group having 2 to 7 carbon atoms such as a methoxycarbonyl group, an ethoxycarbonyl group, or a cyclohexyloxy carbonyl group, a carbonic acid ester group such as a cyano group or t-butylcarbonate, and the like are exemplified.

Among the above-described specific examples, from the viewpoint of a property of procuring a raw material, the easiness in synthesis, and the solubility in monomers and a variety of solvents, the most preferred (n+m+l)-valent organic linking group Z is a group shown below.

(18)

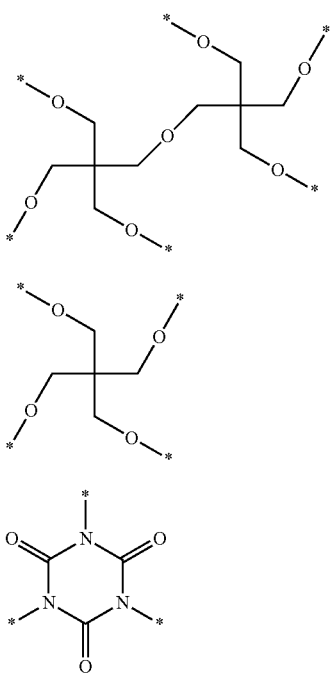

(19)

(20)

In General Formula I, $R^1$ is an alkyl group, an alkenyl group, or an alkynyl group which may have a substituent. The number of carbon atoms is preferably 1 to 30 and more preferably 1 to 20. As the substituent, for example, an alkyl group having 1 to 20 carbon atoms such as a methyl group or an ethyl group, an aryl group having 6 to 16 carbon atoms such as a phenyl group or a naphthyl group, an acyloxy group having 1 to 6 carbon atoms such as a hydroxyl group, an amino group, a carboxyl group, a sulfonamide group, an N-sulfonyl amide group, or an acetoxy group, an alkoxy group having 1 to 6 carbon atoms such as a methoxy group or an ethoxy group, a halogen atom such as chlorine or bromine, an alkoxycarbonyl group having 2 to 7 carbon atoms such as a methoxycarbonyl group, an ethoxycarbonyl group, or a cyclohexyloxy carbonyl group, a carbonic acid ester group such as a cyano group or t-butylcarbonate, and the like are exemplified.

A polymer chain P in the present invention includes at least one polymer skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, a polyvinyl ether skeleton, and a polystyrene skeleton, all of which have a degree of polymerization of 3 or higher, which also means that the polymer chain also includes a polymer, modified substance, or copolymer having the polymer skeleton described above. For example, polyether/polyurethane copolymers, polyether/vinyl monomer copolymers, and the like are exemplified. In addition, the polymer chain may be any of a random copolymer, a block copolymer, and a graft copolymer. Among these, a polymer or copolymer made of a polyacrylate skeleton is particularly preferred.

Furthermore, the polymer chain P is preferably soluble in solvents. In a case where a polymer chain having a low affinity to solvent is used as, for example, the ligand, the affinity to dispersion media weakens, and there is a case where it becomes impossible to ensure an adsorption layer that is enough for dispersion stabilization.

A monomer that forms the polymer chain P is not particularly limited, but is preferably, for example, (meth) acrylic acid esters, crotonic acid esters, vinyl esters, maleic acid diesters, fumaric acid diesters, itaconic acid diesters, aliphatic polyesters, (meth)acrylamides, aliphatic polyamidestyrenes, vinyl ethers, vinyl ketones, olefins, maleimides, (meth)acrylonitrile, monomers having an acidic group, and the like.

Hereinafter, preferred examples of these monomers will be described.

As examples of the (meth)acrylic acid esters, methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth) acrylate, n-hexyl (meth)acrylate, cyclohexyl (meth)acrylate, t-butylcyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy) ethyl (meth)acrylate, 3-phenoxy-2-hydroxypropyl (meth) acrylate, 2-chloroethyl (meth)acrylate, glycidyl (meth) acrylate, 3,4-epoxycyclohexylmethyl (meth)acrylate, vinyl (meth)acrylate, 2-phenylvinyl (meth)acrylate, 1-propenyl (meth)acrylate, ally (meth)acrylate, 2-allyloxyethyl (meth) acrylate, propargyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxy polyethylene glycol (meth) acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth) acrylate, dicyclopentanyl (meth)acrylate, tribromophenyl (meth)acrylate, tribromophenyloxyethyl (meth)acrylate, γ-butyrolactone (meth)acrylate, and the like are exemplified.

As examples of the crotonic acid esters, butyl crotonate, hexyl crotonate, and the like are exemplified.

As examples of the vinyl esters, vinyl acetate, vinyl chloroacetate, vinyl propionate, vinyl butyrate, vinyl methoxy acetate, vinyl benzoate, and the like are exemplified.

As examples of the maleic acid diesters, dimethyl maleate, diethyl maleate, dibutyl maleate, and the like are exemplified.

As examples of the fumaric acid diesters, dimethyl fumarate, diethyl fumarate, dibutyl fumarate, and the like are exemplified.

As examples of the itaconic acid diesters, dimethyl itaconate, diethyl itaconate, dibutyl itaconate, and the like are exemplified.

As examples of the aliphatic polyesters, polycaprolactone, polyvalerolactone, and the like are exemplified.

As examples of the (meth)acrylamides, (meth)acrylamide, N-methyl (meth)acrylamide, N-ethyl (meth)acrylamide, N-propyl (meth)acrylamide, N-isopropyl (meth)acrylamide, N-n-butylacryl (meth)amide, N-t-butyl (meth)acrylamide, N-cyclohexyl (meth)acrylamide, N-(2-methoxyethyl) (meth)acrylamide, N,N-dimethyl (meth)acrylamide, N,N-diethylethyl (meth)acrylamide, N-phenyl (meth)acrylamide, N-nitrophenyl acrylamide, N-ethyl-N-phenyl acrylamide, N-benzyl (meth)acrylamide, (meta)acryloyl morpholine, diacetone acrylamide, N-methylol acrylamide, N-hydroxyethyl acrylamide, vinyl (meth)acrylamide, N,N-diallyl (meth)acrylamide, N-allyl (meth)acrylamide, and the like are exemplified.

As examples of the aliphatic polyamides, polycaprolactame, polyvalerolactame, and the like are exemplified.

As examples of the styrenes, styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected by a group that can be deprotected by an acidic substance (for example, t-Boc or the like) or the like, methyl vinyl benzoate, α-methylstyrene, and the like are exemplified.

As examples of the vinyl ethers, methyl vinyl ether, ethyl vinyl ether, 2-chloroethyl vinyl ether, hydroxyethyl vinyl ether, propyl vinyl ether, butyl vinyl ether, hexyl vinyl ether, octyl vinyl ether, methoxyethyl vinyl ether, phenyl vinyl ether, and the like are exemplified.

As examples of the vinyl ketones, methyl vinyl ketone, ethyl vinyl ketone, propyl vinyl ketone, phenyl vinyl ketone, and the like are exemplified.

As examples of the olefins, ethylene, propylene, isobutylene, butadiene, isoprene, and the like are exemplified.

As examples of the maleimides, maleimide, butyl maleimide, cyclohexyl maleimide, phenyl maleimide, and the like are exemplified.

(Meth)acrylonitrile, heterocyclic groups in which a vinyl group is substituted (for example, vinyl pyridine, N-vinyl pyrrolidone, vinyl carbazole, and the like), N-vinyl formamide, N-vinyl acetamide, N-vinyl imidazole, vinyl caprolactone, and the like can also be used.

The polymer chain P is, furthermore, preferably a group represented by General Formula P1.

General Formula P1

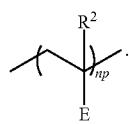

In General Formula P1, E is a substituent configured of at least one of —O—, —CO—, —COO—, —COOR$^y$, an epoxy group, an oxetanyl group, an alicyclic epoxy group, an alkylene group, an alkyl group, or an alkenyl group, R$^y$ is a hydrogen atom or an alkyl group having 1 to 6 carbon atoms, and R$^2$ is a hydrogen atom or an alkyl group having 1 to 6 carbon atoms. np is a number of 3 or more and 500 or less. A plurality of E's and R$^2$'s may be identical to or different from each other.

As the polymer chain represented by General Formula P1, polymer chains shown below are exemplified.

np is preferably 3 to 500, more preferably 4 to 200, and still more preferably 5 to 100.

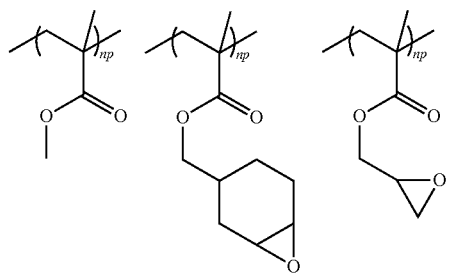

The polymer dispersant may be a compound in which, furthermore, in General Formula I, n and m are 1 and l is 0 and which is represented by General Formula I.

General Formula II

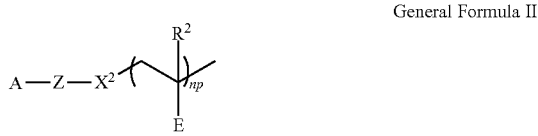

A is preferably a group represented by General Formula A1.

$$(L)_{a1}\text{-}X^4\text{---}X^3\text{---}$$ General Formula A1

In General Formula A1, $X^3$ is a single bond or a divalent organic linking group, $X^4$ is an (a1+1)-valent organic linking group, L is a coordinating group, and a1 is an integer of 1 or more and 2 or less. $X^3$ is identical to $X^2$ in General Formula I, and the preferred range thereof is also identical thereto.

As the (a1+1)-valent organic linking group $X^4$, a group made up of 1 to 60 carbon atoms, 0 to 10 nitrogen atoms, 0 to 40 oxygen atoms, 1 to 120 hydrogen atoms, and 0 to 10 sulfur atoms is preferred, a group made up of 1 to 50 carbon atoms, 0 to 10 nitrogen atoms, 0 to 30 oxygen atoms, 1 to 100 hydrogen atoms, and 0 to 7 sulfur atoms is more preferred, and a group made up of 1 to 40 carbon atoms, 0 to 8 nitrogen atoms, 0 to 20 oxygen atoms, 1 to 80 hydrogen atoms, and 0 to 5 sulfur atoms is particularly preferred.

As specific examples of the (a1+1)-valent organic linking group $X^4$, a group that is configured of a structural unit shown below or a combination of the structural units (a ring structure may be formed) can be exemplified.

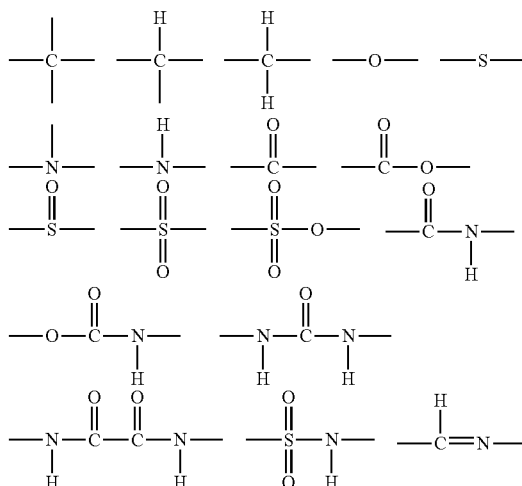

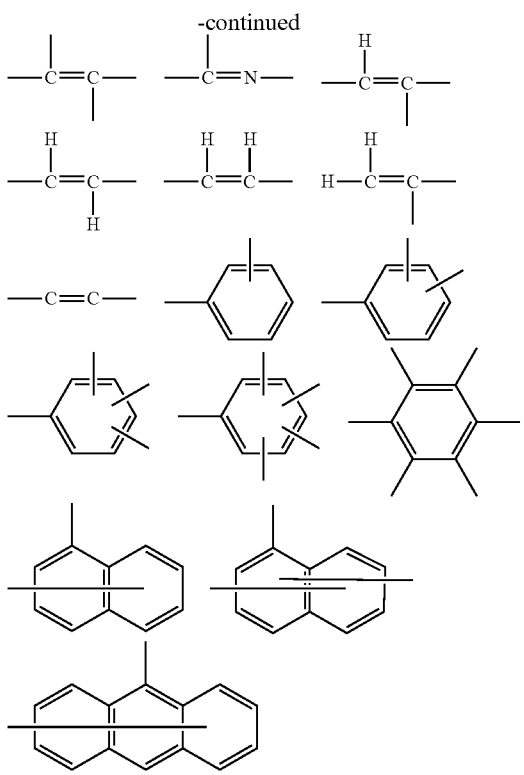

In a case where the (a1+1)-valent organic linking group $X^4$ has a substituent, as the substituent, for example, an alkyl group having 1 to 20 carbon atoms such as a methyl group or an ethyl group, an aryl group having 6 to 16 carbon atoms such as a phenyl group or a naphthyl group, an acyloxy group having 1 to 6 carbon atoms such as a hydroxyl group, an amino group, a carboxyl group, a sulfonamide group, an N-sulfonyl amide group, or an acetoxy group, an alkoxy group having 1 to 6 carbon atoms such as a methoxy group or an ethoxy group, a halogen atom such as chlorine or bromine, an alkoxycarbonyl group having 2 to 7 carbon atoms such as a methoxycarbonyl group, an ethoxycarbonyl group, or a cyclohexyloxy carbonyl group, a carbonic acid ester group such as a cyano group or t-butylcarbonate, and the like are exemplified.

The coordinating group L is preferably at least one selected from an amino group, a carboxy group, a mercapto group, a phosphine group, and a phosphine oxide group. Among them, a carboxy group and a phosphine oxide group are more preferred.

In General Formula A1, as a group including the coordinating group L and the divalent organic linking group $X^4$, groups shown below are preferred. * in the following groups indicates portions that bond to $X^3$.

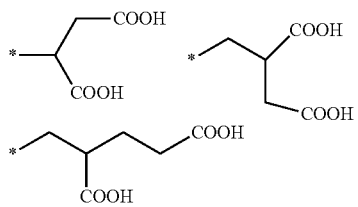

The above-described $X^4$ is approximately shorter than 1 nm in length and has a plurality of coordinating groups in a range of this length. Therefore, the ligand can be adsorbed at multiple points to the quantum dot in a denser state and is thus strongly coordinated. Therefore, the ligand does not deviate from the quantum dot and covers the surface of the quantum dot, and thus the generation of a surface level of the surface of the quantum dot, the oxidation of the quantum dot, and the agglomeration of the quantum dots are prevented, and a decrease in the light emission efficiency of the quantum dots can be suppressed. In addition, even in a case where the ligand has been already coordinated in the quantum dot, the polymer dispersant is capable of entering a gap between the ligands, and, furthermore, it is possible to suppress a decrease in the light emission efficiency of the quantum dots.

The polymer dispersant may be a compound represented by General Formula III.

General Formula III

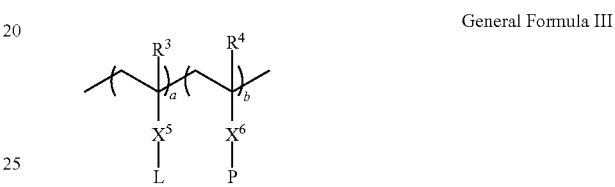

In General Formula III, $X^5$ and $X^6$ are single bonds or divalent organic linking groups, $R^3$ and $R^4$ are hydrogen atoms or alkyl groups having 1 to 6 carbon atoms, and P is a group having a polymer chain including at least one polymer skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, a polyvinyl ether skeleton, and a polystyrene skeleton, all of which have a degree of polymerization of 3 or higher. a and b each are independently numbers of 1 or more, and a+b is 2 or more and 1,000 or less. A plurality of L's may be identical to or different from each other. A plurality of P's may be identical to or different from each other.

$X^5$ and $X^6$ are single bonds or divalent organic linking groups. As the divalent organic linking groups, $X^5$ and $X^6$ are identical to the divalent organic linking group $X^2$ in General Formula I. Particularly, a group including —COO—, —CONH—, —O—, or the like is preferred from the viewpoint of the procurement of a raw material or the easiness in synthesis.

$R^3$ and $R^4$ are alkyl groups having 1 to 6 carbon atoms and preferably hydrogen atoms or methyl groups.

As the polymer chain P in General Formula III, polymer chains shown below are preferred.

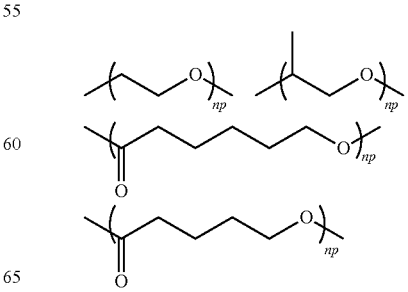

In the polymer chain P, np is preferably 3 to 300, more preferably 4 to 200, and more preferably 5 to 100.

As specific examples of the polymer dispersant represented by General Formula III, polymer dispersants shown below can be exemplified.

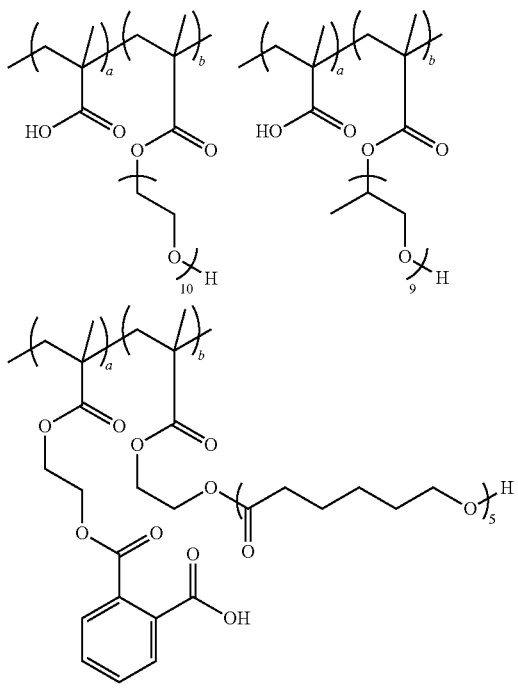

a:b in the polymer dispersant is preferably 1:9 to 7:3 and more preferably 2:8 to 5:5.

The molecular weight of the polymer dispersant is preferably 2,000 to 100,000, more preferably 3,000 to 50,000, and particularly preferably 5,000 to 30,000 in terms of the weight-average molecular weight. In a case where the weight-average molecular weight is in this range, it is possible to favorably disperse the quantum dots in an acrylic monomer.

(Synthesis of Polymer Dispersant)

The ligands in General Formulae I and II can be synthesized using a well-known synthesis method. For example, in a method described in JP2007-277514A, the ligand can be synthesized by substituting an organic colorant portion with a coordinating portion.

The polymer dispersant in General Formula III can be synthesized by the copolymerization of corresponding monomers or a polymer reaction of a precursor polymer. As a monomer having a steric repulsion group in a side chain, for example, commercially available products such as BLEMMER AE-400 (manufactured by NOF Corporation) and BLEMMER AP-800 (manufactured by NOF Corporation can be exemplified.

——Viscosity Adjuster——

The solution of the curable composition that forms the cured substance particles may include a viscosity adjuster as necessary. In the case of adding a viscosity adjuster, it is possible to adjust the viscosity to a desired viscosity. The viscosity adjuster is preferably a filler having a particle diameter of 5 nm to 300 nm. In addition, the viscosity adjuster may be a thixotropy agent. Meanwhile, in the present invention and the present specification, a thixotropy property refers to a property of decreasing the viscosity against an increase in the shear rate in a liquid-form composition, and the thixotropy agent refers to a material having a function of imparting the thixotropy property to the liquid-form composition in the case of being added to the composition. Specific examples of the thixotropy agent include fumed silica, alumina, silicon nitride, titanium dioxide, calcium carbonate, zinc oxide, talc, mica, feldspar, kaolinite (kaolin clay), pyrophyllite (pagodite clay), sericite (silk mica), bentonite, smectite.vermiculites (montmorillonite, beidellite, nontronite, saponite, and the like), organic bentonite, organic smectite, and the like.

——Surfactant——

The solution of the curable composition that forms the cured substance particles may include at least one type of surfactant containing 20% by mass or more of fluorine atoms.

The content of the fluorine atoms in the surfactant is preferably 25% by mass or more and more preferably 28% by mass or more. The upper limit value is not particularly specified, but is, for example, 80% by mass or less and preferably 70% by mass or less.

As the surfactant that is used in the present invention, a compound having an alkyl group having a fluorine atom, a cycloalkyl group having a fluorine atom, or an aryl group having a fluorine atom is preferred.

The alkyl group including a fluorine atom is a linear or branched alkyl group in which at least one hydrogen atom is substituted with a fluorine atom. The number of carbon atoms in the alkyl group is preferably 1 to 10 and more preferably 1 to 4. This alkyl group including a fluorine atom may further have a substituent other than the fluorine atom.

The cycloalkyl group including a fluorine atom is a monocyclic or polycyclic cycloalkyl group in which at least one hydrogen atom is substituted with a fluorine atom. This cycloalkyl group including a fluorine atom may further have a substituent other than the fluorine atom.

The aryl group including a fluorine atom is an aryl group in which at least one hydrogen atom is substituted with a fluorine atom. Examples of this aryl group include a phenyl group and a naphthyl group. The aryl group including a fluorine atom may further have a substituent other than the fluorine atom.

It is considered that, in a case where the surfactant has the above-described structure, the capability of being eccentrically present on a surface becomes favorable, the surface is partially mixed with a polymer in a compatible manner, and phase separation is suppressed.

The molecular weight of the surfactant is preferably 300 to 10,000 and more preferably 500 to 5,000.

The content of the surfactant is, for example, 0.01% to 10% by mass, preferably 0.1% to 7% by mass, and more preferably 0.5% to 4% by mass of the entire composition excluding the solvent. In a case where two or more types of surfactants are used, the total amount thereof needs to be in the above-described range.

Examples of the surfactant include trade name FLORADE FC-430, FC-431 (manufactured by Sumitomo 3M Limited), trade name SURFLON "S-382" (manufactured by AGC Inc.), EFTOP "EF-122A, 122B, 122C, EF-121, EF-126, EF-127, MF-100" (manufactured by Tohkem Products Corp.), trade name PF-636, PF-6320, PF-656, PF-6520 (all manufactured by OMNOVA Solutions Inc.), trade name FTERGENT FT250, FT251, DFX18 (all manufactured by NEOS Company Limited), trade name UNIDYNE DS-401, DS-403, DS-451 (all manufactured by Daikin Industries, Ltd.), trade name MEGAFACE 171, 172, 173, 178K, 178A (all manufactured by DIC Corporation), trade name X-70-

090, X-70-091, X-70-092, X-70-093 (all manufactured by Shin-Etsu Chemical Co., Ltd.), and trade name MEGAFACE R-08, XRB-4 (all manufactured by DIC Corporation).

——Antioxidant——

The curable composition that forms the cured substance particles preferably contains a well-known antioxidant. The antioxidant is an agent that suppresses color fading by heat or light irradiation and color fading by a variety of oxidative gases such as active oxygen, NOx, and SOx (X is an integer). Particularly, in the present invention, the addition of an antioxidant creates an advantage that the coloration of the cured substance particles can be prevented or a decrease in the film thickness by decomposition can be decreased.

In addition, as the antioxidant, two or more types of antioxidants may be used.

In the curable composition that forms the cured substance particles, the content of the antioxidant is preferably 0.2% by mass or more, more preferably 1% by mass or more, and still more preferably 2% by mass or more of the total mass of the curable composition. Meanwhile, there is a case where the interaction of the antioxidant with oxygen changes the property of the antioxidant. The property-changed antioxidant induces the decomposition of the curable composition containing the quantum dots in some cases, and there is a concern that the degradation of the adhesiveness, the deterioration of brittleness, and a decrease in the light emission efficiency of the quantum dots may be caused. From the viewpoint of preventing the above-described concern, the content of the antioxidant is preferably 20% by mass or less, more preferably 15% by mass or less, and still more preferably 10% by mass or less.

The antioxidant is preferably at least one of a radical inhibitor, a metal deactivator, a singlet oxygen eliminator, a super oxide eliminator, or a hydroxy radical eliminator. As such an antioxidant, phenolic antioxidants, hindered amine-based antioxidants, quinone-based antioxidants, phosphorus-based antioxidants, thiol-based antioxidants, and the like are exemplified.

Examples of the phenolic antioxidants include 2,6-di-tert-butyl-p-cresol, 2,6-diphenyl-4-octadecyloxyphenol, distearyl (3,5-di-tert-butyl-4-hydroxybenzyl) phosphonate, 1,6-hexamethylene bis[(3,5-di-tert-butyl-4-hydroxyphenyl) propionic amide], 4,4'-thiobis(6-tert-butyl-m-cresol), 2,2'-methylene bis(4-methyl-6-tert-butylphenol), 2,2'-methylene bis(4-ethyl-6-tert-butylphenol), 4,4'-butylidene bis(6-tert-butyl-m-cresol), 2,2'-ethylidene bis(4,6-di-tert-butylphenol), 2,2'-ethylidene bis(4-sec-butyl-6-tert-butylphenol), 1,1,3-tris(2-methyl-4-hydroxy-5-tert-butylphenyl) butane, 1,3,5-tris(2,6-dimethyl-3-hydroxy-4-tert-butylbenzyl) isocyanurate, 1,3,5-tris(3,5-di-tert-butyl-4-hydroxybenzyl) isocyanurate, 1,3,5-tris(3,5-di-tert-butyl-4-hydroxybenzyl)-2,4,6-trimethylbenzene, 2-tert-butyl-4-methyl-6-(2-acryloyloxy-3-tert-butyl-5-methylbenzyl) phenol, stearyl (3,5-di-tert-butyl-4-hydroxyphenyl) propionate, tetrakis[methyl 3-(3,5-di-tert-butyl-4-hydroxyphenyl) propionate) methane ((ADK STAB AO-60 manufactured by ADEKA Corporation)), thiodiethylene glycol bis[(3,5-di-tert-butyl-4-hydroxyphenyl) propionate], 1,6-hexamethylene bis[(3,5-di-tert-butyl-4-hydroxyphenyl) propionate], bis[3,3-bis(4-hydroxy-3-tert-butylphenyl) butyric acid] glycol ester, bis [2-tert-butyl-4-methyl-6-(2-hydroxy-3-tert-butyl-5-methylbenzyl) phenyl] terephthalate, 1,3,5-tris[(3,5-di-tert-butyl-4-hydroxyphenyl) propionyloxyethyl]isocyanurate, 3,9-bis[1,1-dimethyl-2-{(3-tert-butyl-4-hydroxy-5-methylphenyl) propionyloxy}ethyl]-2,4,8,10-tetraoxaspiro[5,5] undecane, triethylene glycol bis[(3-tert-butyl-4-hydroxy-5-methylphenyl) propionate], and the like.

Examples of the phosphorus-based antioxidants include trisnonylphenyl phosphite, tris[2-tert-butyl-4-(3-tert-butyl-4-hydroxy-5-methylphenylthio)-5-methylphenyl] phosphite, tridecyl phosphite, octyl diphenyl phosphite, di(decyl) monophenyl phosphite, di(tridecyl) pentaerythritol diphosphite, di(nonylphenyl) pentaerythritol diphosphite, bis(2,4-di-tert-butylphenyl) pentaerythritol diphosphite, bis(2,6-di-tert-butyl-4-methylphenyl) pentaerythritol diphosphite, bis (2,4,6-tri-tert-butylphenyl) pentaerythritol diphosphite, bis (2,4-dicumylphenyl) pentaerythritol diphosphite, tetra (tridecyl) isopropylidenediphenol diphosphite, tetra (tridecyl)-4,4'-n-butylidene bis(2-tert-butyl-5-methylphenol) diphosphite, hexa(tridecyl)-1,1,3-tris(2-methyl-4-hydroxy-5-tert-butylphenyl) butanetriphosphite, tetrakis(2,4-di-tert-butylphenyl) biphenylene diphosphonite, 9,10-dihydro-9-oxa-10-phosphaphenanthrene-10-oxide, 2,2'-methylene bis(4,6-tert-butylphenyl)-2-ethylhexyl phosphite, 2,2'-methylene bis(4,6-tert-butylphenyl)-octadecyl phosphite, 2,2'-ethylidene bis(4,6-di-tert-butylphenyl) fluorophosphite; tris(2-[(2,4,8,10-tetrakis tert-butyldibenzo[d,f] [1,3,2]dioxaphosphepin-6-yl)oxy]ethyl)amine, phosphites of 2-ethyl-2-butylpropylene glycol and 2,4,6-tri-tert-butylphenol, and the like. The amount of the phosphorus-based antioxidant added is preferably 0.001 to 10 parts by mass and particularly preferably 0.05 to 5 parts by mass with respect to 100 parts by mass of a polyolefin-based resin.

Examples of the thiol-based antioxidant include dialkyl thiodipropionates such as dilauryl thiodipropionate, dimyristyl thiodipropionate, and distearyl thiodipropionate; pentaerythritol tetra(β-alkylmercaptopropionic acid) esters; and the like.

The hindered amine-based antioxidant is also referred to as hindered amine light stabilizers (HALS) and has a structure in which all of the hydrogen atoms on carbon in the second and sixth positions of piperidine are substituted with methyl groups, preferably, a group represented by Formula 1. Here, in Formula 1, X represents a hydrogen atom or an alkyl group. HALS having, as the group represented by Formula 1, a 2,2,6,6-tetramethyl-4-piperidyl group in which X is a hydrogen atom or a 1,2,2,6,6-pentamethyl-4-piperidyl group in which X is a methyl group is particularly preferably employed. Meanwhile, a number of HALS having a structure in which the group represented by Formula 1 bonds to a —COO— group, that is, a group represented by Formula 2 are on sale, and these commercially available HALS can be preferably used.

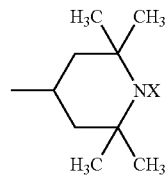

(Formula 1)

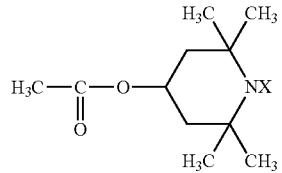

(Formula 2)

Specifically, examples of HALS that can be preferably used in the present invention include HALS represented by the following formulae. Meanwhile, here, 2,2,6,6-tetramethyl-4-piperidyl group is represented by R, and 1,2,2,6,6-pentamethyl-4-piperidyl group is represented by R'.

ROC(=O)(CH$_2$)$_8$C(=O)OR, ROC(=O)C(CH$_3$)=CH$_2$, R'OC(=O)C(CH$_3$)=CH$_2$, CH$_2$(COOR')CH(COOR')CH(COOR')CH$_2$COOR', CH$_2$(COOR')CH(COOR')CH(COOR')CH$_2$COOR', a compound represented by Formula 3, and the like.

(Formula 3)

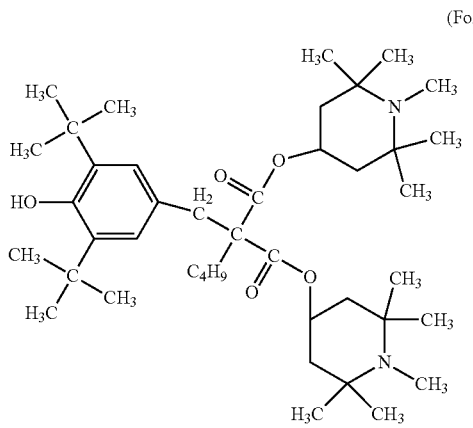

Specifically, hindered amine compounds such as 2,2,6,6-tetramethyl-4-piperidyl stearate, 1,2,2,6,6-pentamethyl-4-piperidyl stearate, 2,2,6,6-tetramethyl-4-piperidyl benzoate, bis(2,2,6,6-tetramethyl-4-piperidyl) sebacate, bis(1,2,2,6,6-pentamethyl-4-piperidyl) sebacate, bis(1-octoxy-2,2,6,6-tetramethyl-4-piperidyl) sebacate, tetrakis(2,2,6,6-tetramethyl-4-piperidyl)-1,2,3,4-butane tetracarboxylate, tetrakis(1,2,2,6,6-pentamethyl-4-piperidyl)-1,2,3,4-butane tetracarboxylate, bis(2,2,6,6-tetramethyl-4-piperidyl)-di(tridecyl)-1,2,3,4-butane tetracarboxylate, bis(1,2,2,6,6-pentamethyl-4-piperidyl).di(tridecyl)-1,2,3,4-butane tetracarboxylate, bis(1,2,2,4,4-pentamethyl-4-piperidyl)-2-butyl-2-(3,5-di-tert-butyl-4-hydroxybenzyl) malonate, 1-(2-hydroxyethyl)-2,2,6,6-tetramethyl-4-piperidinol/diethyl succinate polycondensate, 1,6-bis(2,2,6,6-tetramethyl-4-piperidylamino) hexane/2,4-dichloro-6-morpholino-s-triazine polycondensate, 1,6-bis(2,2,6,6-tetramethyl-4-piperidylamino) hexan/2,4-dichloro-6-t-octylamino-s-triazine polycondensate, 1,5,8,12-tetrakis[2,4-bis(N-butyl-N-(2,2,6,6-tetramethyl-4-piperidyl)amino)-s-triazine-6-yl]-1,5,8,12-tetraazadodecane, 1,5,8,12-tetrakis[2,4-bis(N-butyl-N-(1,2,2,6,6-pentamethyl-4-piperidyl) amino)-s-triazine-6-yl]-1,5,8,12-tetraazadodecane, 1,6,11-tris[2,4-bis(N-butyl-N-(2,2,6,6-tetramethyl-4-piperidyl) amino)-s-triazine-6-yl] aminoundecane, and 1,6,11-tris[2,4-bis(N-butyl-N-(1,2,2,6,6-pentamethyl-4-piperidyl) amino)-s-triazine-6-yl] aminoundecane are exemplified.

In addition, as specific products, TINUVIN 123, TINUVIN 144, TINUVIN 765, TINUVIN 770, TINUVIN 622, CHIMASSORB 944, CHIMASSORB 119 (all manufactured by Ciba Specialty Chemicals, trade names), ADK STAB LA52, ADK STAB LA57, ADK STAB LA62, ADK STAB LA67, ADK STAB LA82, ADK STAB LA87, ADK STAB LX335 (all manufactured by ADEKA Corporation, trade names), and the like can be exemplified, but the products are not limited thereto.

Among HALS, HALS having a relative small molecular weight is easily diffused and is thus preferred. From this viewpoint, preferred HALS is a compound represented by ROC(=O)(CH$_2$)$_8$C(=O)OR or R'OC(=O)C(CH$_3$)=CH$_2$ or the like.

Among the above-described antioxidants, at least one of a hindered phenol compound, a hindered amine compound, a quinone compound, a hydroquinone compound, a tripherol compound, an asparaginic acid compound, or a thiol compound is more preferred, and at least one of a citric acid compound, an ascorbic acid compound, or a tocopherol compound is still more preferred. These compounds are not particularly limited, but hindered phenol, hindered amine, quinone, hydroquinone, tocopherol, asparaginic acid, thiol, citric acid, tocopheryl acetate, tocopheryl phosphate, salts or ester compounds thereof, and the like are preferably exemplified.

Hereinafter, examples of the antioxidant will be shown.

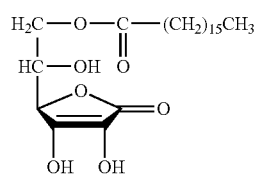

Ascorbic acid stearic acid ester

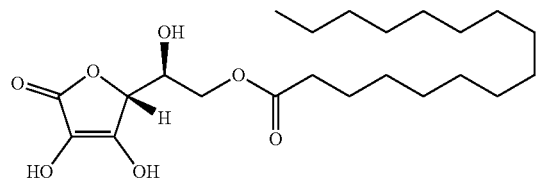

Ascorbic acid palmitic acid ester (ascorbic palmitate)

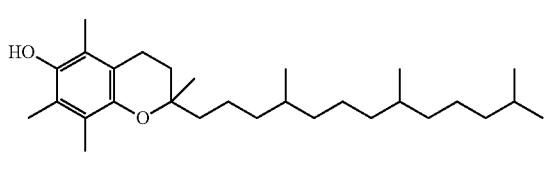

α tocopherol

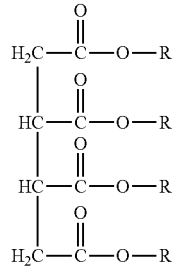

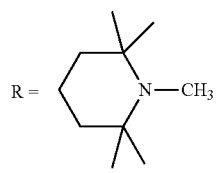

Tetrakis(1,2,2,6,6-pentamethyl-4-piperidyl)butane-1,2,3,4-tetracarboxylate (Trade name: ADK STAB LA-52 manufactured by ADEKA Corporation)

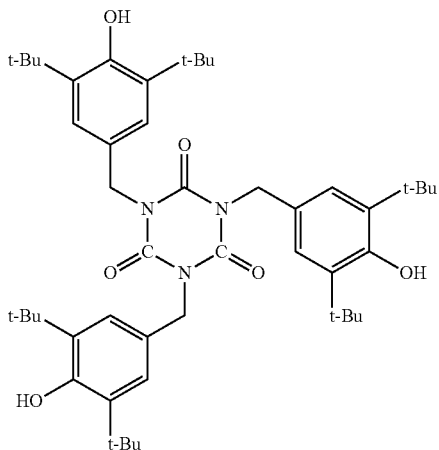 [SMILES: CC(C)(C)c1cc(Cn2c(=O)n(Cc3cc(C(C)(C)C)c(O)c(C(C)(C)C)c3)c(=O)n(Cc3cc(C(C)(C)C)c(O)c(C(C)(C)C)c3)c2=O)cc(C(C)(C)C)c1O]

1,3,5-tris(3,5-di-tert-butyl-4-hydroxybenzyl)-1,3,5-triazino-2,4,6(1H,3H,5H)-trione (Trade name: ADK STAB AO-20 manufactured by ADEKA Corporation)

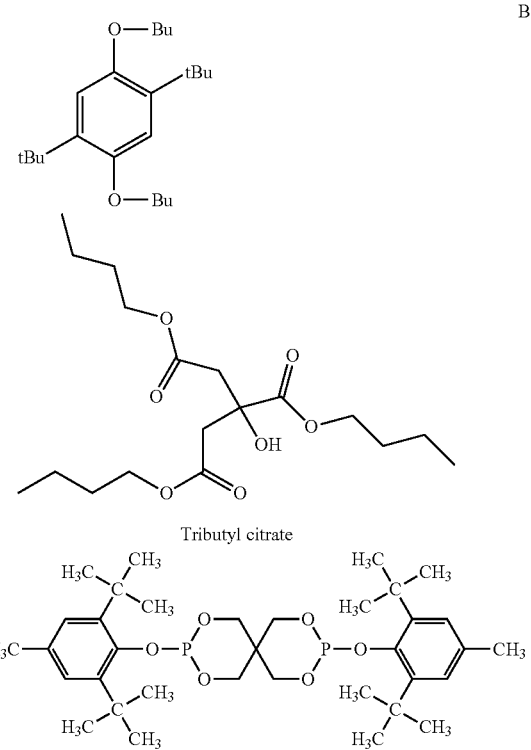

B-3

Tributyl citrate 3,9-bis(2,6-di-tert-butyl-4-methylphenoxy)-2,4,8,10-tetraoxa-3,9-diphosphite spiro[5,5]undecane (Trade name: ADK STAB PEP-36 manufactured by ADEKA Corporation)

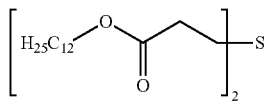

Dilauryl thiodipropionate (IRGANOXPS 800, 800FD manufactured by BASF)

—Oxygen Getter Agent—

As the oxygen getter agent, it is possible to use a well-known substance that is used as a getter agent, and the oxygen getter agent may be any of an inorganic getter agent or an organic getter agent and preferably includes at least one compound selected from a metal oxide, a metal halide, a metal sulfate, a metal perchlorate, a metal carbonate, a metal alkoxide, a metal carboxylate, a metal chelate, or zeolite (aluminum silicate).

As such an oxygen getter agent, calcium oxide (CaO), barium oxide (BaO), magnesium oxide (MgO), strontium oxide (SrO), lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$), and the like are exemplified.

The organic getter agent is not particularly limited as long as the organic getter agent is a material that entrains water by a chemical reaction and does not become opaque before and after the reaction. Here, an organic metal compound refers to a compound having a metal-carbon bond, a metal-oxygen bond, a metal-nitrogen bond, or the like. In a case where water and the organic metal compound react with each other, the above-described bond is broken by a hydrolysis reaction, and the organic metal compound turns into a metal hydroxide. Depending on metal, hydrolytic polycondensation may be carried out on the metal hydroxide after the reaction, thereby increasing the molecular weight.

As the metal of the metal alkoxide, the metal carboxylate, and the metal chelate, metal that is highly reactive with water as the organic metal compound, that is, a metallic atom that is easily broken from a variety of bonds by water is preferably used. Specifically, aluminum, silicon, titanium, zirconium, bismuth, strontium, calcium, copper, sodium, and lithium are exemplified. In addition, cesium, magnesium, barium, vanadium, niobium, chromium, tantalum, tungsten, indium, iron, and the like are exemplified. Particularly, a drying agent of the organic metal compound having aluminum as a central metal is preferred from the viewpoint of the dispersibility in resins or the reactivity with water. As an organic group, unsaturated hydrocarbons such as a methoxy group, an ethoxy group, a propoxy group, a butoxy group, a 2-ethylhexyl group, an octyl group, a decyl group, a hexyl group, an octadecyl group, and a stearyl group, alkoxy groups or carboxyl groups containing a saturated hydrocarbon, a branched unsaturated hydrocarbon, a branched saturated hydrocarbon, or a cyclic hydrocarbon, β-diketonate groups such as an acetylacetonate group and a dipivaroylmethanate group are exemplified.

Among these, aluminum ethyl acetoacetates having 1 to 8 carbon atoms, which are represented by the following chemical formula are preferably used since it is possible to form a sealing composition having excellent transparency.

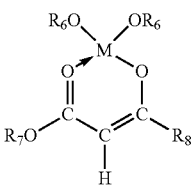

(In the formula, $R_5$ to $R_8$ represent organic groups including an alkyl group, aryl group, alkoxy group, cycloalkyl group, or acyl group having 1 or more and 8 or less carbon atoms, and M represents a trivalent metallic atom. Meanwhile, $R_5$ to $R_8$ may be identical organic groups or different organic groups respectively.)

The aluminum ethyl acetoacetates having 1 to 8 carbon atoms are put on the market by, for example, Kawaken Fine Chemicals Co., Ltd. and Hope Chemical Co., Ltd. and are procurable.

The oxygen getter agent has a particle form or a powder form. Generally, the average particle diameter of the oxygen getter agent needs to be set to be in a range of less than 20 µm and is preferably 10 µm or less, more preferably 2 µm or less, and still more preferably 1 µm or less. From the viewpoint of the scattering property, the average particle diameter of the oxygen getter agent is preferably 0.3 to 2 µm and more preferably 0.5 to 1.0 µm. The average particle diameter mentioned herein refers to the average value of particle diameters computed from a particle size distribution measured using a dynamic light scattering method.

—Polymerization Inhibitor—

The solution of the curable composition that forms the cured substance particles may contain a polymerization inhibitor. Regarding the content of the polymerization inhibitor, in the case of blending an appropriate amount of the polymerization inhibitor, which is 0.001% to 1% by mass, more preferably 0.005% to 0.5% by mass, and still more preferably 0.008% to 0.05% by mass of the entire polymerizable monomer, it is possible to suppress a change in the viscosity over time while maintaining a high curing sensitivity. On the other hand, in a case where the amount of the polymerization inhibitor added becomes excess, poor curing or the coloration of a cured substance by polymerization inhibition is caused, and thus there is an appropriate amount. The polymerization inhibitor may be added during the manufacturing of a polymerizable monomer or may be added to the curable composition afterwards. As a preferred polymerization inhibitor, hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylene bis(4-methyl-6-tert-butylphenol), N-nitrosophenylhydroxyamine primary cerium salt, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, dimethylaniline, and the like are exemplified, and preferred are p-benzoquinone, 2,2,6,6-tetramethylpiperidine-1-oxyl free radical, 4-hydroxy-2,2,6,6-tetramethylpiperidine-1-oxyl free radical, and phenothiazine. These polymerization inhibitors suppress the generation of a polymer impurity not only during the manufacturing of a polymerizable monomer but also during the storage of the curable composition and suppress the deterioration of a pattern-forming property during imprinting.

——Inorganic Particles——

Furthermore, the solution of the curable composition that forms the cured substance particles preferably contains inorganic particles. Containing inorganic particles can enhance the non-permeability to oxygen. Examples of the inorganic particles include silica particles, alumina particles, zirconium oxide particles, zinc oxide particles, titanium oxide particles, and inorganic lamellar compounds such as mica or talc. In addition, the inorganic particles preferably have a flat plate shape from the viewpoint of enhancing the non-permeability to oxygen, and the aspect ratio (r=a/b, here, a>b) of the inorganic particles is preferably 2 or more and 1,000 or less, more preferably 10 or more and 800 or less, and particularly preferably 20 or more and 500 or less. A larger aspect ratio is preferred since the effect for enhancing the non-permeability to oxygen is excellent; however, in a case where the aspect ratio is too large, the physical strength of films or particle dispersibility in compositions for curing is poor.

To the solution of the curable composition that forms the cured substance particles, in addition to the above-described components, a mold release agent, a silane coupling agent, an ultraviolet absorber, a light stabilizer, an age inhibitor, a plasticizer, an adhesion promoter, a thermal polymerization initiator, a coloring agent, elastomer particles, a photoacid proliferator, a photobase generator, a basic compound, a fluid adjustment agent, a defoamer, or the like may be added as necessary.

A method for preparing the solution of the curable composition that forms the cured substance particles is not particularly limited, and the solution may be prepared according to a preparation order of an ordinary curable composition.

<Binder>

As the binder in the wavelength conversion layer 12, a material that is capable of preferably dispersing the cured substance particles of the (meth)acrylate compound and has a strong gas barrier property is used.

A material that forms the binder preferably has an oxygen permeation coefficient of $1.0 \times 10^1$ (cc·10 µm)/(m$^2$·day·atm) or less.

Meanwhile, the oxygen permeation coefficient of the binder is a value measured using a gas permeation rate testing method based on JIS K 7126-2 2006. As a measurement instrument, an oxygen permeation rate measurement instrument OX-TRAN1_50 manufactured by MOCON, Inc. can be used. The measurement temperature is set to 23° C. and the humidity is set to 50%.

As the SI unit of the oxygen permeation coefficient, it is possible to use (fm·10 µm)/(s·Pa). (1 fm·10 µm)/(s·Pa) can be converted to 8.752 (cc·10 µm)/(m$^2$·day·atm). fm is read as femtometre, and 1 fm is equal to $10^{-15}$ m.

As materials having an oxygen permeation coefficient in the above-described range, polyvinyl alcohols (PVA), copolymer resins of butenediol and vinyl alcohol (BVOH), and the like are exemplified.

In addition, the binder may include two or more materials described above.

The polyvinyl alcohol may be a modified polyvinyl alcohol having a vinyl group and a substituent such as a (meth)acryloyl group, a carboxyl group, or a carbonyl group.

In a case where a modified polyvinyl alcohol having at least one of a vinyl group and a (meth)acryloyl group is used as the material of the binder, it is possible to form a state in which the binder and the cured substance particles chemically bond to each other at least partially through a polymerizable crosslinking group, and it is possible to improve the durability of the wavelength conversion layer.

The oxygen permeation coefficient of the polyvinyl alcohol is approximately $1.0 \times 10^0$ to $1.0 \times 10^1$ (cc·10 µm)/(m$^2$·day·atm).

In addition, the oxygen permeation coefficient of the butenediol-vinyl alcohol copolymer resin is approximately $1.0 \times 10^{-1}$ (cc·10 µm)/(m$^2$·day·atm).

In addition, the degree of saponification of the polyvinyl alcohol is preferably 86 to 97 mol %.

As the degree of saponification increases, the gas barrier property of the polyvinyl alcohol is further enhanced. On the other hand, as the degree of saponification decreases, the affinity to the (meth)acrylate compound that is the parent material of the cured substance particles is enhanced, and thus the dispersibility of the cured substance particles becomes favorable. Therefore, in a case where the degree of saponification is set to be in the above-described range, it is possible to preferably disperse the cured substance particles while enhancing the gas barrier property of the binder.

Meanwhile, the degree of saponification in the present invention refers to a value measured according to JIS K 6726 1994.

[Auxiliary Layer]

The auxiliary layer 14a and the auxiliary layer 14b are layers having the oxygen permeability of $1.0 \times 10^0$ to $1.0 \times 10^{-2}$ cc/(m²·day·atm), and sandwiching and protecting the wavelength conversion layer 12.

Since the auxiliary layer 14a and the auxiliary layer 14b have the same configuration except for the fact that the auxiliary layer 14a and the auxiliary layer 14b are disposed on different sides of the wavelength conversion layer 12, in the following description, both are collectively referred to as an auxiliary layer in a case where it is not necessary to distinguish the auxiliary layer 14a and the auxiliary layer 14b.

The auxiliary layer may be made of an organic material, or may be made of an inorganic material as long as the auxiliary layer is transparent to visible light and the oxygen permeability satisfies the above range.

Here, the expression "transparent to visible light" refers to the fact that the light ray transmittance in the visible light range is 80% or more and preferably 85% or more. The light ray transmittance that is used as the index of transparency can be computed by measuring the total light ray transmittance and the quantity of scattered light using a method described in JIS-K7105, that is, an integrating sphere-type light ray transmittance measurement instrument and subtracting a diffusion transmittance from the total light ray transmittance.

Examples of the organic material used as the auxiliary layer include polyvinyl alcohol (PVA), a copolymer resin of butenediol and vinyl alcohol (BVOH), and a copolymer resin of ethylene and vinyl alcohol (EVOH).

Moreover, examples of the inorganic material include silicon oxide ($SiO_x$) and the like.

The auxiliary layer 14a and the auxiliary layer 14b may be made of the same material or different materials.

A thickness of the auxiliary layer may be set according to the material for forming the auxiliary layer such that the oxygen permeability satisfies the above range.

The thickness of the auxiliary layer 14a and the thickness of the auxiliary layer 14b may be same or different from each other.

In a case where an inorganic material is used as the material of the auxiliary layer, since the thickness of the auxiliary layer is thin and the self-supporting property is low, a configuration in which the auxiliary layer is supported by a support layer as shown in FIG. 2 is preferable.

[Support Layer]

The support layer 20a and the support layer 20b support the auxiliary layer.

As described above, the support layer preferably supports the auxiliary layer in a case where the auxiliary layer is made of an inorganic material, but the present invention is not limited thereto, and the support layer may support the auxiliary layer even in a case where the auxiliary layer is made of an organic material.

Since the support layer 20a and the support layer 20b have the same configuration except for the fact that the support layer 20a is disposed on the auxiliary layer 14a and the support layer 20b is disposed on the auxiliary layer 14b, in the following description, both are collectively referred to as a support layer in a case where it is not necessary to distinguish the support layer 20a and the support layer 20b.

The base material as the support layer is preferably a band-like flexible support that is transparent to visible light. Here, the expression "transparent to visible light" refers to the fact that the light ray transmittance in the visible light range is 80% or more and preferably 85% or more. The light ray transmittance that is used as the index of transparency can be computed by measuring the total light ray transmittance and the quantity of scattered light using a method described in JIS-K7105, that is, an integrating sphere-type light ray transmittance measurement instrument and subtracting a diffusion transmittance from the total light ray transmittance. Regarding flexible base material, it is possible to refer to Paragraphs 0046 to 0052 of JP2007-290369A and Paragraphs 0040 to 0055 of JP2005-096108A.

As such support layer, polyethylene terephthalate films, films made of a polymer having a cyclic olefin structure, polystyrene films, and the like are exemplified as preferred examples.

The average film thickness of the support layer is preferably 10 μm or more and 500 μm or less, more preferably 20 μm or more and 400 μm or less, and still more preferably 30 μm or more and 300 μm or less from the viewpoint of the impact resistance, the handleability, and the like of the wavelength conversion film. In an aspect in which the retroreflection of light is increased such as a case where the concentration of the quantum dots (cured substance particles) that are included in the wavelength conversion layer is decreased or a case where the thickness of the wavelength conversion layer is decreased, the absorptivity of light having a wavelength of 450 nm is preferably lower, and thus, from the viewpoint of suppressing a decrease in brightness, the average film thickness of the support layer is preferably 40 μm or less and more preferably 25 μm or less.

In addition, the in-plane retardation Re (589) at a wavelength of 589 nm of the support layer is preferably 1,000 nm or less, more preferably 500 nm or less, and still more preferably 200 nm or less.

At the time of inspecting the presence or absence of a foreign substance or a defect after the production of the wavelength conversion film, in a case where the presence or absence of a foreign substance or a defect is observed after two polarization plates are disposed at an extinction position and the wavelength conversion film is inserted therebetween, it is easy to find a foreign substance or a defect. In a case where Re (589) of the support layer is in the above-described range, it becomes easier to find a foreign substance or a defect at the time of inspection using a polarization plate, which is preferable.

Here, Re (589) can be measured by making light having an input wavelength of 589 nm in a normal direction to the film using AxoScan OPMF-1 (manufactured by Opto Science, Inc.).

The wavelength conversion film according to the embodiment of the present invention is not limited to the configuration in which a wavelength conversion layer and an auxiliary layer are provided, and if necessary, a support layer is further provided, and the wavelength conversion film may have a configuration in which various functional layers used in optical films such as a light scattering layer are provided.

<Method for Manufacturing Wavelength Conversion Film>

A method for manufacturing the wavelength conversion film of the embodiment of the present invention is not limited, and, hereinafter, an example of a preferred method will be described.

The method for manufacturing the wavelength conversion film includes a preparation step of preparing a solution (dispersion liquid) of the curable composition by dispersing the wavelength conversion particles in a mixed solution of the polymerizable compound that serves as the (meth)acrylate compound and the polymerization initiator, an emulsification step of emulsifying the solution (dispersion liquid) of the curable composition by putting and stirring the solution in an aqueous solution of a material that serves as the binder, a particle-forming step of forming the cured substance particles by irradiating the binder aqueous solution (emulsified liquid) obtained by emulsifying the solution of the curable composition with light to polymerize the curable composition, an application step of applying the binder aqueous solution (coating fluid) including the cured substance particles onto the auxiliary layer, a curing step of forming the wavelength conversion layer by drying and curing the coating fluid applied onto the auxiliary layer, and a laminating step of laminating the auxiliary layer on the wavelength conversion layer.

(Preparation Step)

In the preparation step, the solution (dispersion liquid) of the curable composition including the wavelength conversion particles such as the quantum dots is prepared. Specifically, the respective components such as the wavelength conversion particles, the polymerizable compound, the polymerization initiator, and the polymer dispersant dispersed in the organic solvent are mixed together using a tank or the like, thereby preparing the solution (dispersion liquid) of the curable composition that forms the cured substance particles. Meanwhile, the dispersion liquid may not include the organic solvent.

(Emulsification Step)

In the emulsification step, the prepared dispersion liquid is put into an aqueous solution of a material that serves as the binder, stirred, and emulsified. The stirring may be carried out using a commercially available stirrer.

The binder aqueous solution may be prepared by dissolving a compound that serves as the binder such as PVA in water. Meanwhile, as the water, pure water or ion exchange water is preferably used.

The concentration of this aqueous solution is not particularly limited and may be appropriately set depending on the amounts of the compound that serves as the binder and the dispersion liquid injected, the diameters of the cured substance particles, and the like.

The curable composition that serves as the parent material of the cured substance particles is hydrophobic, and the wavelength conversion particles are also hydrophobic. On the other hand, the compound that serves as the binder is hydrophilic. Therefore, the dispersion liquid is dispersed in the binder aqueous solution in a state in which the wavelength conversion particles are included in liquid droplets of the curable composition that serves as the parent material.

Therefore, the diameter of the dispersion liquid that has been turned into liquid droplets can be adjusted to a desired diameter by appropriately adjusting the shearing force during stirring, the viscosity of the dispersion liquid, the viscosity of the binder aqueous solution, and the like.

In addition, in the emulsification step, an emulsifier may be added. As the emulsifier, it is possible to use an anionic surfactant, a cationic surfactant, a nonionic surfactant, and the like.

(Particle-Forming Step)

In the particle-forming step, the binder aqueous solution (emulsified liquid) obtained by emulsifying and dispersing the dispersion liquid is irradiated with light such as ultraviolet light (UV light) or heated to polymerize the curable composition, thereby forming the cured substance particles.

Meanwhile, in the particle-forming step, the binder aqueous solution is preferably irradiated with ultraviolet light under stirring.

(Application Step)

In the application step, the binder aqueous solution (coating fluid) in which the cured substance particles produced as described above are dispersed is applied on the auxiliary layer prepared in advance.

The application method of the coating fluid is not particularly limited, and various known application methods such as spin coating, die coating, bar coating, and spray coating can be used.

The coated film thickness of the coating fluid may be adjusted so that the thickness of the wavelength conversion layer after drying becomes a desired thickness.

Here, in a case where the auxiliary layer is made of a resin material, a solution containing a resin material forming the auxiliary layer, such as EVOH, PVA, or the like is prepared, the solution may be applied on a temporary support, and may be cured to form an auxiliary layer, or a commercially available film may be used. As a commercially available film that can be used as the auxiliary layer, POVAL film, EVAL film (manufactured by Kuraray Co., Ltd.), G-Polymer (Nippon Synthetic Chemical Industry Co., Ltd.), and the like can be used.

When the auxiliary layer is made of an inorganic material, a known vapor deposition method such as vacuum deposition, capacitive coupled plasma chemical vapor deposition (CCP-CVD), inductively coupled plasma chemical vapor deposition (ICP-CVD), and sputtering may be used to form an inorganic film, as the auxiliary layer, on a surface of the support layer such as PET film.

(Curing Step)

In the curing step, the coated films formed on the auxiliary layer in the application step are dried and cured, thereby forming the wavelength conversion layer.

A method for heating and drying of the coating fluids is not particularly limited, and a variety of well-known methods for drying an aqueous solution such as heating and drying using a heater, heating and drying using a hot air, or heating and drying by the joint use of a heater and hot air can be used.

(Laminating Step)

In the laminating step, another auxiliary layer (laminate of the auxiliary layer and the support layer) is adhered and laminated on the formed wavelength conversion layer. For adhering of the wavelength conversion layer and the auxiliary layer, various known pressure sensitive adhesives used in optical films can be used.

Alternatively, in a case where the auxiliary layer is made of a resin material, a solution containing a resin material for forming the auxiliary layer may be prepared, the solution may be applied on the wavelength conversion layer and cured to form the auxiliary layer.

With the above-described steps, the wavelength conversion film is produced.

<Backlight Unit>

Figure 3:
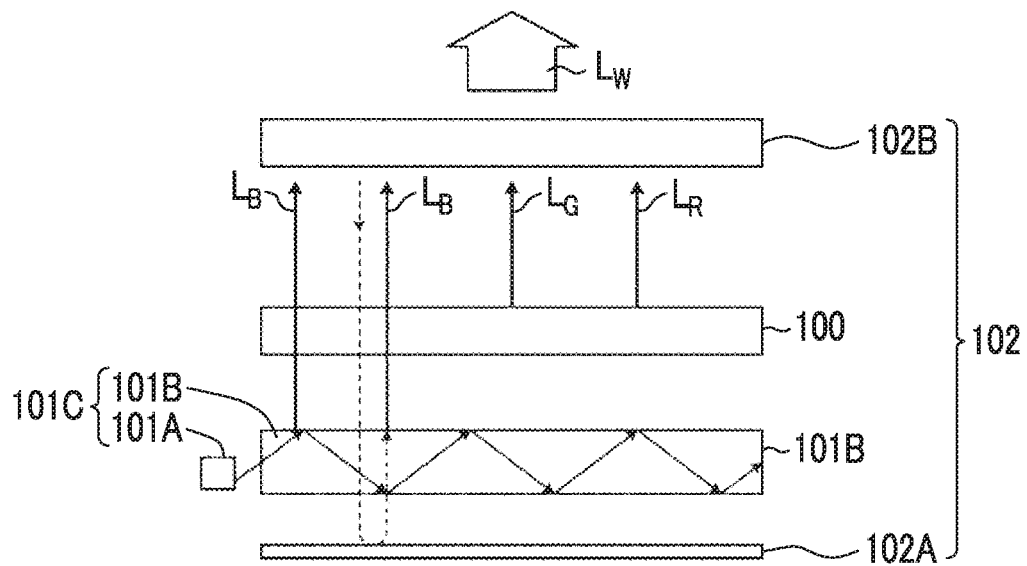
FIG. 3 is a schematic configurational cross-sectional view of a backlight unit comprising the wavelength conversion film.

A backlight unit comprising the wavelength conversion film of the embodiment of the present invention will be described with reference to a drawing. FIG. 3 is a schematic view showing a schematic configuration of the backlight unit.

As shown in FIG. 3, a backlight unit 102 comprises a planar light source 101C made up of a light source 101A that releases primary light (blue light $L_B$) and a light guide plate 101B that guides and releases the primary light released from the light source 101A, a wavelength conversion film 100 provided on the planar light source 101C, a reflection plate 102A that is disposed to face the wavelength conversion film 100 across the planar light source 101C, and a retroreflective member 102B. Meanwhile, in FIG. 3, the reflection plate 102A, the light guide plate 101B, the wavelength conversion film 100, and the retroreflective member 102B are shown to be apart from each other, however, in actual cases, these members may be formed in close contact with each other.

The wavelength conversion film 100 is the wavelength conversion film according to the embodiment of the present invention and emits fluorescent light using at least some of the primary light $L_B$ released from the planar light source 101C as excitation light and releases secondary light (green light $L_G$ and red light $L_R$) made of this fluorescent light and the primary light $L_B$ that has passed through the wavelength conversion film 100. For example, the wavelength conversion film 100 is a wavelength conversion film formed of wavelength conversion layers, which include cured substance particles including quantum dots that emit green light $L_G$ by irradiation with blue light $L_B$ and quantum dots that emit red light La, and are sandwiched by the auxiliary layers.

In FIG. 3, $L_B$, $L_G$, and $L_R$ released from the wavelength conversion film 100 are incident on the retroreflective member 102B, the respective incident light rays are repeatedly reflected between the retroreflective member 102B and the reflection plate 102A and pass through the wavelength conversion film 100 many times. As a result, in the wavelength conversion film 100, a sufficient amount of excitation light (blue light $L_B$) is absorbed by the cured substance particles (wavelength conversion particles) in the wavelength conversion layer, a necessary amount of fluorescent light ($L_G$ and $L_R$) is emitted, and white light $L_W$ is embodied and released from the retroreflective member 102B.

From the viewpoint of realizing high brightness and favorable color reproducibility, as the backlight unit, a backlight made to serve as a light source at multiple wavelengths is preferably used. For example, it is preferable to emit blue light having a light emission central wavelength in a wavelength range of 430 to 480 nm and having a peak of a light emission intensity with a half-width of 100 nm or less, green light having a light emission central wavelength in a wavelength range of 500 to 600 nm and having a peak of a light emission intensity with a half-width of 100 nm or less, and red light having a light emission central wavelength in a wavelength range of 600 to 680 nm and having a peak of a light emission intensity with a half-width of 100 nm or less.

From the viewpoint of additional improvement in brightness and color reproducibility, the wavelength range of the blue light that the backlight unit emits is more preferably 440 nm to 460 nm.

From the same viewpoint, the wavelength range of the green light that the backlight unit emits is preferably 520 nm to 560 nm and more preferably 520 nm to 545 nm.

In addition, from the same viewpoint, the wavelength range of the red light that the backlight unit emits is more preferably 610 nm to 640 nm.

In addition, from the same viewpoint, the half-widths of the respective light emission intensities of the blue light, the green light, and the red light that the backlight unit emits are all preferably 80 nm or less, more preferably 50 nm or less, still more preferably 40 nm or less, and far still more preferably 30 nm or less. Among these, the half-widths of the light emission intensity of the blue light are particularly preferably 25 nm or less.

In the above description, the light source 101A is, for example, a blue light emitting diode that emits blue light having a light emission central wavelength in a wavelength range of 430 nm to 480 nm, but an ultraviolet light emitting diode that emits ultraviolet light may be used. As the light source 101A, it is possible to use other laser light sources and the like of a light emitting diode. In the case of including a light source that emits ultraviolet light, the light source needs to include a fluorescent body that emits blue light, a fluorescent body that emits green light, and a fluorescent body that emits red light by irradiation with ultraviolet light in the cured substance particles in the wavelength conversion layer of the wavelength conversion film.

The planar light source 101C may be a planar light source, as shown in FIG. 3, made up of the light source 101A and the light guide plate 101B that guides and releases primary light released from the light source 101A or may be a planar light source in which the light source 101A is disposed side by side with the wavelength conversion film 100 on a plane parallel to the wavelength conversion film and a diffusion plate is provided instead of the light guide plate 101B. The former planar light source is generally referred to as an edge light mode, and the latter planar light source is generally referred to as a direct backlight mode.

Meanwhile, in the present embodiment, a case where the planar light source is used as the light source has been described, but any light sources other than the planar light source can be used as the light source.

In FIG. 3, as the configuration of the backlight unit, the edge light mode in which the light guide plate, the reflection plate, and the like are provided as configurational members has been described, but the configuration may be the direct backlight mode. As the light guide plate, it is possible to use well-known light guide plates without any limitations.

In addition, as the reflection plate 102A, it is possible to use well-known reflection plates without any particular limitations, and the well-known reflection plates are described in JP3416302B, JP3363565B, JP4091978B, JP3448626B, and the like, the contents of which are incorporated into the present invention.

The retroreflective member 102B may be configured of a well-known diffusion plate or diffusion sheet, a prism sheet (for example, BEF series manufactured by Sumitomo 3M Limited or the like), a light guide device, and the like. The configuration of the retroreflective member 102B is described in JP3416302B, JP3363565B, JP4091978B, JP3448626B, and the like, the contents of which are incorporated into the present invention.

<Liquid Crystal Display Device>

Figure 4:
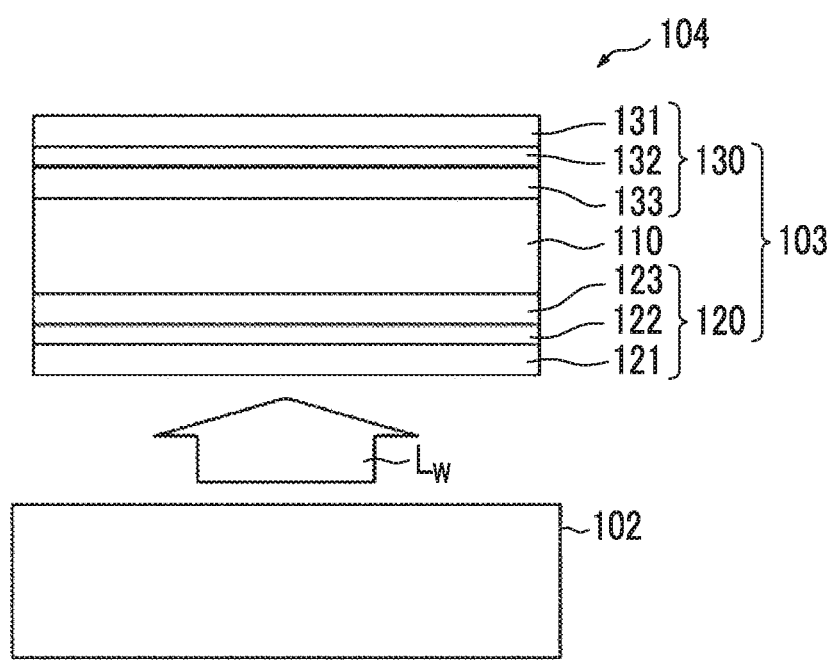
FIG. 4 is a schematic configurational cross-sectional view of a liquid crystal display device comprising the backlight unit.

The above-described backlight unit 102 can be applied to liquid crystal display devices. FIG. 4 is a schematic view showing a schematic configuration of a liquid crystal display device.

As shown in FIG. 4, a liquid crystal display device 104 comprises the backlight unit 102 of the above-described embodiment and a liquid crystal cell unit 103 disposed to face the retroreflective member side of the backlight unit.

As shown in FIG. 4, the liquid crystal cell unit 103 has a configuration in which a liquid crystal cell 110 is sandwiched between polarization plates 120 and 130, and the polarization plates 120 and 130 respectively have a configuration in which both main surfaces of a polarizer 122 or 132 is protected by polarization plate protective films 121 and 123 or 131 and 133.

The liquid crystal cell 110, the polarization plates 120 and 130, which configure the liquid crystal display device 104, and configurational elements thereof are not particularly limited, and it is possible to use members that are produced using a well-known method or commercially available products without any limitations. In addition, it is needless to say that it is also possible to provide a well-known interlayer such as an adhesive layer between the respective layers.

The driving mode of the liquid crystal cell 110 is not particularly limited, and it is possible to use a variety of modes such as twisted nematic (TN), super twisted nematic (STN), vertical alignment (VA), in-plane switching (IPS), and optically compensated bend cell (OCB). The liquid crystal cell is preferably a VA mode, an OCB mode, an IPS mode, or a TN mode, but is not limited thereto. As a configuration of a liquid crystal display device in a VA mode, a configuration described in JP2008-262161A is exemplified as an example. However, specific configurations of the liquid crystal display device are not particularly limited, and a well-known configuration can be employed.

The liquid crystal display device 104 further has an optical compensation member that carried out optical compensation and subsidiary functional layers such as an adhesive layer as necessary. In addition, a surface layer such as a forward scattering layer, a primer layer, an antistatic layer, or an undercoat layer may be disposed together with (or instead of) a color filter substrate, a thin layer transistor substrate, a lens film, a diffusion sheet, a hardcoat layer, an antireflection layer, a low-reflection layer, an antiglare layer, or the like.

The backlight-side polarization plate 120 may have a phase difference film as the polarization plate protective film 123 on the liquid crystal cell 110 side. As the above-described phase difference film, it is possible to use a well-known cellulose acylate film or the like.

The backlight unit 102 and the liquid crystal display device 104 comprise the wavelength conversion film of the embodiment of the present invention. Therefore, the backlight unit and the liquid crystal display device exhibit the same effects as the wavelength conversion film of the embodiment of the present invention, do not allow the light emission intensity of the wavelength conversion layer including the quantum dots to be easily decreased, and have a high brightness.

EXAMPLES

Hereinafter, the present invention will be more specifically described on the basis of examples. Materials, amounts used, proportions, processing contents, processing orders, and the like described in the following examples can be appropriately modified within the scope of the gist of the present invention. Therefore, the scope of the present invention is supposed not to be interpreted in a limited manner by specific examples described below.

Example 1

<Production of Wavelength Conversion Film>

A wavelength conversion film having a configuration in which a wavelength conversion layer formed by dispersing cured substance particles of a (meth)acrylate compound including quantum dots as wavelength conversion particles in a binder was sandwiched between auxiliary layers was produced.

(Preparation Step)

As a solution of a curable composition that formed the cured substance particles, a solution 1 (dispersion liquid 1) was prepared by mixing individual components of quantum dots, a curable compound, a polymerization initiator, and the like using a tank or the like.

—Composition of Dispersion Liquid 1—

The dispersion liquid 1 having the following composition was prepared.

| | |
|---|---|
| A toluene dispersion liquid of quantum dots 1 (light emission maximum: 520 nm) | 20 parts by mass |
| A toluene dispersion liquid of quantum dots 2 (light emission maximum: 630 nm) | 2 parts by mass |
| Dicyclopentanyl acrylate (DCP: FA-513AS (manufactured by Hitachi Chemical Co., Ltd.)) | 78.8 parts by mass |
| Photopolymerization initiator (IRGACURE TPO (manufactured by BASF)) | 0.2 parts by mass |
| Polymer dispersant (A-1 (synthesized product)) | 1 part by mass |

As the quantum dots 1 and 2, nanocrystals having a core-shell structure (InP/ZnS) described below were used.

Quantum dots 1: INP530-10 (manufactured by NN-Labs, LLC)

Quantum dots 2: INP620-10 (manufactured by NN-Labs, LLC)

(Emulsification Step)

The prepared dispersion liquid 1 was put into an aqueous solution of a material that served as the binder, stirred, and emulsified.

As the material of the binder, KURARAY POVAL PVA-CST (manufactured by Kuraray Co., Ltd., degree of saponification: 95.5 to 96.5 mol %) was used, and this material was injected into water, heated, and dissolved, thereby obtaining a binder aqueous solution. For the binder aqueous solution, the amount of water was adjusted so that the viscosity at a temperature of 23° C. reached 100 cP.

The prepared dispersion liquid 1 was injected into the binder aqueous solution and emulsified by stirring using a resolver, thereby obtaining an emulsified liquid.

The amount ratio between the solution of the curable composition and the binder aqueous solution was adjusted so that the volume ratio of the cured substance particles in the wavelength conversion layer after the formation of the wavelength conversion layer reached 30%.

(Particle-Forming Step)

The emulsified liquid was irradiated with ultraviolet light under stirring to polymerize the curable composition and form the cured substance particles, thereby producing a coating fluid.

The curable composition was cured by being irradiated with 3,000 mJ/cm2 of ultraviolet light using a 200 W/cm air-cooling metal halide lamp (manufactured by Eye Graphics Co., Ltd.).

(Application Step)

The binder aqueous solution (coating fluid) containing the cured substance particle produced as described above is applied on the auxiliary layer prepared in advance.

Here, the auxiliary layer was produced as follows.

Polyvinyl alcohol (PVA) was used as a material of the auxiliary layer. Polyvinyl alcohol was dissolved in water to prepare an aqueous solution, the solution was applied on a temporary support and dried to produce an auxiliary layer having a thickness of 50 μm.

The oxygen permeability of the auxiliary layer was 1.0× $10^0$ cc/(m²·day·atm) as measured by the gas permeation rate testing method based on JIS K 7126.

(Curing Step)

The wavelength conversion layer was formed by drying and curing the coating fluid applied on the auxiliary layer.

The film thickness of the dried wavelength conversion layer was 50 μm.

(Laminating Step)

Another auxiliary layer produced in the same manner as described above was adhered onto the wavelength conversion layer via a pressure sensitive adhesive, to produce a wavelength conversion film in which the wavelength conversion layer is sandwiched between the auxiliary layers.

Example 2

A wavelength conversion film was produced in the same manner as in Example 1 except for the fact that, as the material of the binder, KURARAY POVAL PVA 205 (manufactured by Kuraray Co., Ltd., degree of saponification: 87.0 to 89.0 mol %) was used.

Example 3

A wavelength conversion film was produced in the same manner as in Example 2 except for the fact that, as the material of the auxiliary layer, a butenediol-vinyl alcohol copolymer resin (BVOH manufactured by Nippon Synthetic Chemical Industry Co., Ltd.) was used.

The oxygen permeability of the auxiliary layer was 2.0× $10^{-2}$ cc/(m²·day·atm).

Example 4

A wavelength conversion film was produced in the same manner as in Example 2 except for the fact that, as the material of the auxiliary layer, an ethylene-vinyl alcohol copolymer resin (EVOH) was used, and the thickness of the auxiliary layer was 100 μm.

The oxygen permeability of the auxiliary layer was 1.0× $10^{-2}$ cc/(m²·day·atm).

Example 5

A wavelength conversion film was produced in the same manner as in Example 1 except for the fact that the auxiliary layer made of silicon oxide ($SiO_x$) and the support layer were provided.

The specific producing method is as follows.

As the support layer, a polyethylene terephthalate (PET) film (manufactured by Toyobo Co., Ltd., trade name: "COSMOSHINE (registered trademark) A4300", thickness: 50 μm) was used.

A silicon oxide film was formed on the support layer using a general vacuum vapor deposition apparatus to produce a laminated film. The thickness of the silicon oxide film was 0.10 μm.

After applying the coating fluid on the auxiliary layer of the produced laminated film, the coating fluid was dried and cured and the wavelength conversion layer was formed.

Next, on the formed wavelength conversion layer, a laminated film produced in the same manner as described above was adhered using a pressure sensitive adhesive (OCA 8146-1 manufactured by 3M Co., Ltd.) to produce a wavelength conversion film. The laminated film was laminated on the wavelength conversion layer with the auxiliary layer (silicon oxide film) of the laminated film facing the wavelength conversion layer side.

The oxygen permeability of the auxiliary layer was 1.0× $10^{-2}$ cc/(m²·day·atm).

Comparative Example 1

The wavelength conversion film was produced in the same manner as in Example 1 except for the fact that an auxiliary layer is not provided.

Comparative Example 2

A wavelength conversion film was produced in the same manner as in Example 5 except for the fact that the thickness of the silicon oxide film was 0.12 μm. The oxygen permeability of the auxiliary layer was 0.9× $10^{-2}$ cc/(m²·day·atm).

<Evaluation Items>

Changes over time in the light emission performance of the wavelength conversion films produced in the examples and the comparative examples were measured as described below and evaluated.

(Initial Brightness)

A commercially available tablet terminal including a blue light source in a backlight unit (trade name "Kindle (registered trademark) Fire HDX 7", manufactured by Amazon.com, Inc., hereinafter, simply referred to as "Kindle Fire HDX 7" in some cases) was disassembled, and the backlight unit was removed. Instead of the wavelength conversion film "quantum dot enhancement film (QDEF)" combined in the backlight unit, the wavelength conversion film of each of the examples and the comparative examples were combined thereinto. A liquid crystal display device was produced as described above.

The produced liquid crystal display device was lighted, the entire screen was made to exhibit white, and the brightness was measured using a brightness meter (trade name "SR3", manufactured by Topcon Corporation) installed at a location 520 mm apart in the vertical direction from the surface of a light guide plate. The initial brightness $Y_0$ (cd/m²) was evaluated based on the following evaluation standards.

—Evaluation Standards—

A: $Y_0 \geq 530$

B: $530 > Y_0 \geq 515$

C: $515 > Y_0 \geq 500$

D: $500 \geq Y_0$ (Evaluation of Light Durability)

In a room that was maintained at 85° C., each wavelength conversion film was placed on a commercially available blue light source (OPSM-H150X 142B manufactured by OPTEX-FA Co., Ltd.), and the wavelength conversion film was continuously irradiated with blue light for 1,000 hours. After 1,000 hours, the wavelength conversion film was removed and combined into Kindle Fire HDX 7 in the same manner as described above, the brightness was measured, and the relative brightness $Y_L$ after light irradiation with respect to the initial brightness $Y_0$ was computed. The relative brightness $Y_L$ was evaluated on the basis of the following evaluation standards.

—Evaluation Standards—

A: $Y_L \geq 95\%$

B: $95\% > Y_L \geq 90\%$

C: $90\% > Y_L \geq 80\%$

D: $80\% > Y_L$

The results are shown in Table 1.

TABLE 1

| | Auxiliary layer | | | Support layer | | Wavelength conversion layer Binder | | Evaluation | |
|---|---|---|---|---|---|---|---|---|---|
| | Material | Thickness μm | Oxygen permeability cc/(m²·day·atm) | | Material | Material | Degree of saponification mol % | Initial brightness | Light durability |
| Example 1 | PVA | 50 | $1.0 \times 10^{0}$ | Absent | — | PVA | 95.5 to 96.5 | B | B |
| Example 2 | PVA | 50 | $1.0 \times 10^{0}$ | Absent | — | PVA | 87.0 to 89.0 | A | B |
| Example 3 | BVOH | 50 | $2.0 \times 10^{-2}$ | Absent | — | PVA | 87.0 to 89.0 | A | A |
| Example 4 | EVOH | 100 | $1.0 \times 10^{-2}$ | Absent | — | PVA | 87.0 to 89.0 | A | A |
| Example 5 | $SiO_x$ | 0.10 | $1.0 \times 10^{-2}$ | Present | PET | PVA | 87.0 to 89.0 | C | A |
| Comparative Example 1 | — | — | — | Absent | — | PVA | 87.0 to 89.0 | A | D |
| Comparative Example 2 | $SiO_x$ | 0.12 | $0.9 \times 10^{-2}$ | Present | PET | PVA | 87.0 to 89.0 | D | A |

From the results shown in Table 1, it is found that, in the examples of the present invention, compared to the comparative example, initial brightness is high and a decrease in the brightness over time can be suppressed.

Further, it is found from the comparison of Example 1 and Example 2 that the degree of saponification is preferably 86 to 97 mol % when the material of the binder is polyvinyl alcohol.

From above, the effects of the present invention are clear.

EXPLANATION OF REFERENCES 10a, 10b: wavelength conversion film
12: wavelength conversion layer
14a, 14b: auxiliary layer
16: binder
18: cured substance particle
20a, 20b: support layer
100: wavelength conversion film
101A: light source
101B: light guide plate
101C: planar light source
102: backlight unit
102A: reflection plate
102B: retroreflective member
103: liquid crystal cell unit
104: liquid crystal display device
110: liquid crystal cell
120, 130: polarization plate
121, 123, 131, 133: polarization plate protective film
122, 132: polarizer

What is claimed is:

1. A wavelength conversion film comprising:
a wavelength conversion layer; and
auxiliary layers sandwiching the wavelength conversion layer,
wherein the wavelength conversion layer has polyvinyl alcohol and cured substance particles of a (meth)acrylate compound including wavelength conversion particles,
wherein an oxygen permeability of the auxiliary layer is $1.0 \times 10^{0}$ to $1.0 \times 10^{-2}$ cc/(m²·day·atm), and
wherein a degree of saponification of the polyvinyl alcohol is 86 to 89 mol %.

2. The wavelength conversion film according to claim 1, wherein at least one of the auxiliary layers is a layer made of polyvinyl alcohol.

3. The wavelength conversion film according to claim 1, wherein at least one of the auxiliary layers is a layer made of polyvinyl alcohol.

4. The wavelength conversion film according to claim 1, wherein at least one of the auxiliary layers is a layer made of copolymer resins of butenediol and vinyl alcohol.

5. The wavelength conversion film according to claim 3, wherein at least one of the auxiliary layers is a layer made of copolymer resins of butenediol and vinyl alcohol.

6. The wavelength conversion film according to claim 1, wherein at least one of the auxiliary layers is a layer made of copolymer resins of ethylene and vinyl alcohol.

7. The wavelength conversion film according to claim 5, wherein at least one of the auxiliary layers is a layer made of copolymer resins of ethylene and vinyl alcohol.

8. The wavelength conversion film according to claim 1, wherein at least one of the auxiliary layers is a layer made of silicon oxide.

9. The wavelength conversion film according to claim 7, wherein at least one of the auxiliary layers is a layer made of silicon oxide.

10. The wavelength conversion film according to claim 8, further comprising:
a support layer which supports the layer made of silicon oxide which is used as the auxiliary layer.

11. The wavelength conversion film according to claim 9, further comprising:
a support layer which supports the layer made of silicon oxide which is used as the auxiliary layer.

* * * * *